United States Patent
Chen et al.

(10) Patent No.: US 10,228,400 B2
(45) Date of Patent: Mar. 12, 2019

(54) ELECTRIC METER, AN ELECTRIC METER SYSTEM AND A METHOD OF PROVIDING BRANCH-LEVEL READINGS FOR A POWER DISTRIBUTION NETWORK

(71) Applicants: ILLINOIS AT SINGAPORE PTE LTD, Singapore (SG); AGENCY FOR SCIENCE, TECHNOLOGY AND RESEARCH, Singapore (SG)

(72) Inventors: Binbin Chen, Singapore (SG); Sreejaya Viswanathan, Singapore (SG)

(73) Assignees: Illinois at Singapore Pte Ltd, Singapore (SG); Agency for Science, Technology and Research, Singapore (SG)

(*) Notice: Subject to any disclaimer, the term of this patent is extended or adjusted under 35 U.S.C. 154(b) by 9 days.

(21) Appl. No.: 15/307,162

(22) PCT Filed: Apr. 30, 2015

(86) PCT No.: PCT/SG2015/050091
§ 371 (c)(1),
(2) Date: Oct. 27, 2016

(87) PCT Pub. No.: WO2015/167400
PCT Pub. Date: Nov. 5, 2015

(65) Prior Publication Data
US 2017/0045561 A1    Feb. 16, 2017

(30) Foreign Application Priority Data
Apr. 30, 2014    (SG) .............................. 10201401947S

(51) Int. Cl.
*G01R 22/10* (2006.01)
*G01R 19/25* (2006.01)
*G01R 15/20* (2006.01)

(52) U.S. Cl.
CPC ........... *G01R 22/10* (2013.01); *G01R 15/205* (2013.01); *G01R 19/2513* (2013.01)

(58) Field of Classification Search
CPC ........ G01R 22/10; G01R 22/06; G01R 22/00; G01R 21/00; G01R 19/2513; G01R 19/00; G01R 15/205
See application file for complete search history.

(56) References Cited

PUBLICATIONS

Xu et al., Stick-On Piezoelectromagnetic AC Current Monitoring of Circuit Breaker Panels, Mar. 2013, IEEE Sensors Journal, vol. 13, No. 3, pp. 1055-1064.*

* cited by examiner

*Primary Examiner* — Toan Le
(74) *Attorney, Agent, or Firm* — K. David Crockett, Esq.; Niky Economy Syrengelas, Esq.

(57) ABSTRACT

According to various embodiments, there is provided an electric meter including a sensor circuit configured to provide a plurality of instantaneous magnetic field measurements; a processing circuit configured to generate a time-series of magnetic field vectors, each magnetic field vector of the time-series of magnetic field vectors including the plurality of instantaneous magnetic field measurements; and a total current determination circuit configured to determine a total current, wherein the total current is a sum of currents of each branch of a plurality of branches of a power distribution network; wherein the processing circuit is further configured to compute a de-mixing matrix based on the determined total current and the time-series of magnetic field vectors, and further configured to linear transform each magnetic field vector using the de-mixing matrix to determine a current of each branch.

26 Claims, 10 Drawing Sheets

$$s(t) = A\ I(t)$$

1332    1334    1336

$$\begin{bmatrix}0.32\\0.48\\0.17\end{bmatrix} = \begin{bmatrix}1 & 0.4 & 0\\0.2 & 1.4 & 0.2\\0 & 0.3 & 0.8\end{bmatrix}\begin{bmatrix}0.2\\0.3\\0.1\end{bmatrix}$$

$$\begin{bmatrix}0.12\\0.42\\0.09\end{bmatrix} = \begin{bmatrix}? & 0.4 & ?\\? & 1.4 & ?\\? & 0.3 & ?\end{bmatrix}\begin{bmatrix}0\\0.3\\0\end{bmatrix}$$

FIG. 14

ELECTRIC METER, AN ELECTRIC METER SYSTEM AND A METHOD OF PROVIDING BRANCH-LEVEL READINGS FOR A POWER DISTRIBUTION NETWORK

CROSS-REFERENCE TO RELATED APPLICATIONS

This application claims the benefit of Singapore Patent Application number 10201401947S filed 30 Apr. 2014, the entire contents of which are incorporated herein by reference for all purposes.

TECHNICAL FIELD

The present invention relates to electric meters, electric meter systems and methods of providing branch-level readings for a power distribution network.

BACKGROUND

With the increasing awareness of global issues pertaining to energy overuse amongst the general public, there has been an increased interest in deploying electricity monitoring systems, such as electric meters or electric sub-meters, for obtaining fine-grained electricity usage information. Existing electric sub-meters make use of sensors such as current transducers or their variants, to measure current. As these sensors need to be clamped onto physical current carrying wires, the installation of these existing electric sub-meters requires opening up of electricity distribution panels to locate the current-carrying wires. Often, qualified electricians need to be hired for retrofitting the electricity panels with these electric sub-meters. This creates obstacles for the general public to adopt the electric sub-meters.

Therefore, there is a need for electric meters that can be easily installed with minimum effort and expertise, while providing sufficient accuracy.

SUMMARY

According to various embodiments, there may be provided an electric meter including a sensor circuit configured to provide a plurality of instantaneous magnetic field measurements, a processing circuit configured to generate a time-series of magnetic field vectors, each magnetic field vector of the time-series of magnetic field vectors including the instantaneous magnetic field measurements, and a total current determination circuit configured to determine a total current, wherein the total current is a sum of currents of each branch of a plurality of branches of a power distribution network. The processing circuit may be further configured to compute a de-mixing matrix based on the determined total current and the time-series of magnetic field vectors, and may be further configured to linear transform each magnetic field vector using the de-mixing matrix to determine a current of each branch.

According to various embodiments, there may be provided an electric meter system including a plurality of electric meters and a mother processing circuit. The electric meter system may further include a total current determination circuit configured to determine a total current. The total current may be a sum of currents of each branch of a plurality of branches of a power distribution network. Each electric meter of the plurality of electric meters may include a sensor circuit configured to provide instantaneous magnetic field measurements and a daughter processing circuit configured to generate a time-series of magnetic field vectors, each magnetic field vector of the time-series of magnetic field vectors including the plurality of instantaneous magnetic field measurements. The mother processing circuit may be configured to receive partially processed data from at least one electric meter of the plurality of electric meters and may be further configured to provide a current reading to a user interface. At least one of the mother processing circuit or the daughter processing circuits of the plurality of electric meters may be configured to compute a de-mixing matrix based on the determined total current and the time-series of magnetic field vectors, and may be further configured to linear transform each magnetic field vector using the de-mixing matrix to determine a current of each branch.

According to various embodiments, there may be provided a method of providing branch-level readings for a power distribution network, the method including providing a plurality of instantaneous magnetic field measurements using a sensor circuit; generating a time-series of magnetic field vectors using a processing circuit, wherein each magnetic field vector of the time-series of magnetic field vectors comprises the plurality of instantaneous magnetic field measurements; determining a total current using a total current determination circuit, wherein the total current is a sum of currents of each branch of a plurality of branches of a power distribution network; computing a de-mixing matrix based on the determined total current and the time-series of magnetic field vectors, using the processing circuit; and linear transforming each magnetic field vector using the de-mixing matrix to determine a current of each branch, using the processing circuit.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which:

FIG. 13 shows an example of the linear relationship between an instantaneous magnetic field vector S(t) and a corresponding instantaneous electric current vector I(t).

FIG. 14 shows an example of using a dominating-branch-based method to estimate the second column of a mixing matrix, when the second branch is the dominating branch.

DESCRIPTION

Embodiments described below in context of the devices are analogously valid for the respective methods, and vice versa. Furthermore, it will be understood that the embodiments described below may be combined, for example, a part of one embodiment may be combined with a part of another embodiment.

In this context, the electric meter as described in this description may include a memory which is for example used in the processing carried out in the electric meter. A memory used in the embodiments may be a volatile memory, for example a DRAM (Dynamic Random Access Memory) or a non-volatile memory, for example a PROM (Programmable Read Only Memory), an EPROM (Erasable PROM), EEPROM (Electrically Erasable PROM), or a flash memory, e.g., a floating gate memory, a charge trapping memory, an MRAM (Magnetoresistive Random Access Memory) or a PCRAM (Phase Change Random Access Memory).

In an embodiment, a "circuit" may be understood as any kind of a logic implementing entity, which may be special purpose circuitry or a processor executing software stored in a memory, firmware, or any combination thereof. Thus, in an embodiment, a "circuit" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "circuit" may also be a processor executing software, e.g. any kind of computer program, e.g. a computer program using a virtual machine code such as e.g. Java. Any other kind of implementation of the respective functions which will be described in more detail below may also be understood as a "circuit" in accordance with an alternative embodiment.

With the increasing awareness of global issues pertaining to energy overuse amongst the general public, there has been an increased interest in deploying electricity monitoring systems, such as electric meters, or otherwise known as electricity sub-meters, for obtaining fine-grained electricity usage information. Existing electric sub-meters make use of sensors such as current transducers or their variants to measure current. As these sensors need to be clamped onto physical current carrying wires, the installation of these existing electric sub-meters requires opening up of electricity distribution panels to locate the current-carrying wires. Often, qualified electricians need to be hired for retrofitting the electricity panels with these electric sub-meters. This creates obstacles for the general public to adopt the electric sub-meters. Therefore, there is a need for electric meters that can be easily installed with minimum effort and expertise, while providing sufficient accuracy.

Figure 1:
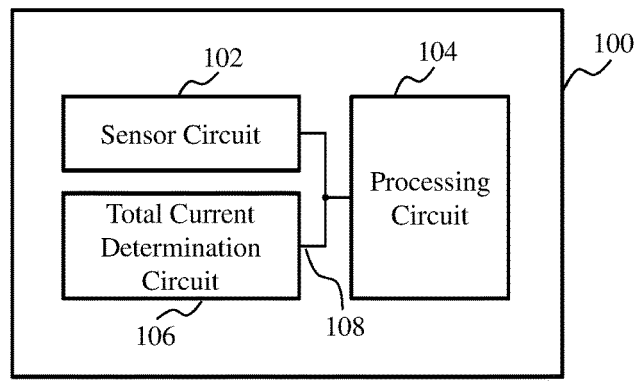
FIG. 1 shows a conceptual diagram of an electric meter in accordance to various embodiments.

FIG. 1 shows a conceptual diagram of an electric meter 100 in accordance to various embodiments. The electric meter 100 may include a sensor circuit 102 configured to provide a plurality of instantaneous magnetic field measurements. The electric meter 100 may further include a processing circuit 104 configured to generate a time-series of magnetic field vectors. Each magnetic field vector of the time-series of magnetic field vectors may include the plurality of instantaneous magnetic field measurements. The electric meter 100 may further include a total current determination circuit 106 configured to determine a total current, which is a sum of currents of each branch of a plurality of branches of a power distribution network. Each instantaneous magnetic field measurement of the plurality of instantaneous magnetic field measurements may be a measurement of a sum of magnetic fields resulting from a subset of the plurality of branches. The subset of the plurality of branches may include at least one branch of the plurality of branches. The subset of the plurality of branches may also include all branches of the plurality of branches. The total current determination circuit may be further configured to receive a measurement of the total current from an external source or a main electricity meter. The processing circuit 104 may be further configured to compute a de-mixing matrix based on the determined total current and the time-series of magnetic field vectors. The processing circuit 104 may be further configured to linear transform each magnetic field vector of the time-series of magnetic field vectors, using the de-mixing matrix, to determine a current of each branch of the power distribution network. The sensor circuit 102, the processing circuit 104 and the total current determination circuit 106 may be connected to each other via a connection 108. The connection 108 may be at least one of a mechanical or an electrical connection.

In other words, according to various embodiments, the electric meter 100 may include a sensor circuit 102, a processing circuit 104 and a total current determination circuit 106. The sensor circuit 102 may be configured to measure a plurality of instantaneous magnetic fields near to or in a vicinity of each branch of a power distribution network having a plurality of branches. The processing circuit 104 may be configured to generate a time-series of magnetic field vectors. Each magnetic field vector of the time-series of magnetic field vectors may include the plurality of instantaneous magnetic field measurements near to each branch. Based on the time-series of magnetic field vectors, as well as a determined total current, the processing circuit 104 may compute a de-mixing matrix. The processing circuit 104 may use the de-mixing matrix to linear transform each magnetic field vector to determine a current of each branch. The total current may be determined by the total current determination circuit 106, for providing to the processing circuit 104. The sensor circuit 102, the processing circuit 104 and the total current determination circuit 106 may be interconnected via at least one of a mechanical or an electrical connection 108.

Figure 2:
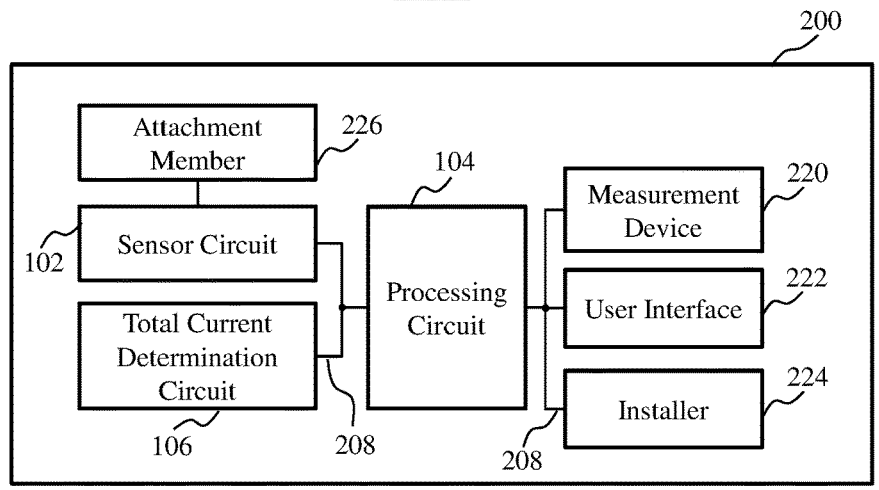
FIG. 2 shows a conceptual diagram of an electric meter in accordance to various embodiments.

FIG. 2 shows a conceptual diagram of an electric meter 200 in accordance to various embodiments. The electric meter 200, similar to the electric meter 100 of FIG. 1, may include a sensor circuit 102, a processing circuit 104 and a total current determination circuit 106. The sensor circuit 102 may be configured to provide a plurality of instantaneous magnetic field measurements. The processing circuit 104 may be configured to generate a time-series of magnetic field vectors. Each magnetic field vector of the time-series of magnetic field vectors may include the plurality of instantaneous magnetic field measurements. The processing circuit 104 may be further configured to compute a de-mixing matrix based on a total current and the time-series of magnetic field vectors. The processing circuit 104 may be further configured to linear transform each magnetic field vector of the time-series of magnetic field vectors, using the de-mixing matrix, to determine a current usage of each branch of the power distribution network. The total current may be determined by the total current determination circuit 106. The total current determination circuit may be configured to receive a measurement of the total current from an external source or a main electricity meter.

In addition to the electric meter 100 of FIG. 1, the electric meter 200 may include at least one peripheral device. The at least one peripheral device may be a measurement device 220, a user interface 222 or an installer 224. The measurement device 220 may be configured to measure a total current, in other words, measure an aggregated current of the plurality of branches in the power distribution network. The measurement device 220 may also be configured to measure a total voltage, or in other words, an aggregated voltage of the power distribution network. The user interface 222 may be configured to display to a user, a measurement of at least one branch of the power distribution network. The measurement displayed to the user may be at least one of an electric current, a voltage or a power. The user interface 222 may be further configured to display other information, such as an operation status of the electric meter 200, a status of the sensor circuit 102 or statuses of other components within the electric meter 200. The user interface 222 may also serve as an input device for the user to provide instructions to the electric meter 200, for example, resetting the sensor circuit 102. The installer 224 may be configured to turn off all branches of the plurality of branches and then sequentially turn on each branch, to facilitate computation of the de-mixing matrix by the processing circuit 104. The installer 224 may be a circuit. The installer 224 may also be a software module which may be run on a processor. Alternatively, the function of the installer 224 may be performed manually by a human operator. The installer 224 may receive instructions from the user through the user interface 222. The sensor circuit 102, the processing circuit 104 and the total current determination circuit 106 may be connected to each other via a connection 208. The processing circuit 104, the measurement device 220, the user interface 222 and the installer 224 may also be connected to each other via the connection 208. The connection 208 may be at least one of a mechanical or an electrical connection. The electric meter 200 may further include an attachment member 226, which may be mechanically connected to the sensor circuit 102. The attachment member 226 may also be mechanically connected to the electric meter 200, for example, through an enclosure or housing of the electric meter 200. The attachment member 226 may be configured to attach the sensor circuit 102 above an electricity distribution board. The attachment member 226 may also be configured to attach the entire electric meter above an electricity distribution board. The attachment member 226 may be at least one of an adhesive, a suction cup or an enclosure shaped to fit above an electricity distribution board.

Figure 3:
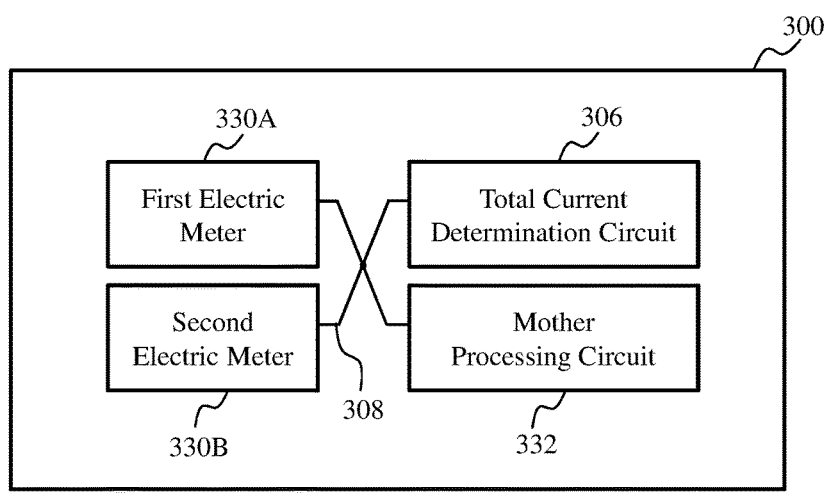
FIG. 3 shows a conceptual diagram of an electric meter system in accordance to various embodiments.

FIG. 3 shows a conceptual diagram of an electric meter system 300 in accordance to various embodiments. The electric meter system 300 may include a plurality of electric meters, a mother processing circuit 332 and a total current determination circuit 306. The plurality of electric meters may include a first electric meter 330A and a second electric meter 330B. The total current determination circuit 306 may be configured to determine a total current, which is a sum of currents of each branch of a plurality of branches of a power distribution network. The second electric meter 330B may be identical or similar to the first electric meter 330A. Each electric meter of the plurality of electric meters may include a sensor circuit configured to provide a plurality of instantaneous magnetic field measurements. Each electric meter of the plurality of electric meters may further include a daughter processing circuit configured to generate a time-series of magnetic field vectors. Each magnetic field vector of the time-series of magnetic field vectors may include the plurality of instantaneous magnetic field measurements of each branch. The mother processing circuit 332 may be configured to receive partially processed data from at least one of the first electric meter 330A or the second electric meter 330B, and further configured to provide a current reading to a user interface. At least one of the mother processing circuit 332 or the plurality of daughter processing circuits may be configured to compute a de-mixing matrix based on the determined total current and the time-series of magnetic field vectors, and further configured to linear transform each magnetic field vector using the de-mixing matrix to determine a current of each branch. The first electric meter 330A, the second electric meter 330B, the total current determination circuit 306 and the mother processing circuit 332 may be connected to each other via a connection 308. The connection 308 may be at least one of a mechanical or an electrical connection.

Figure 4:
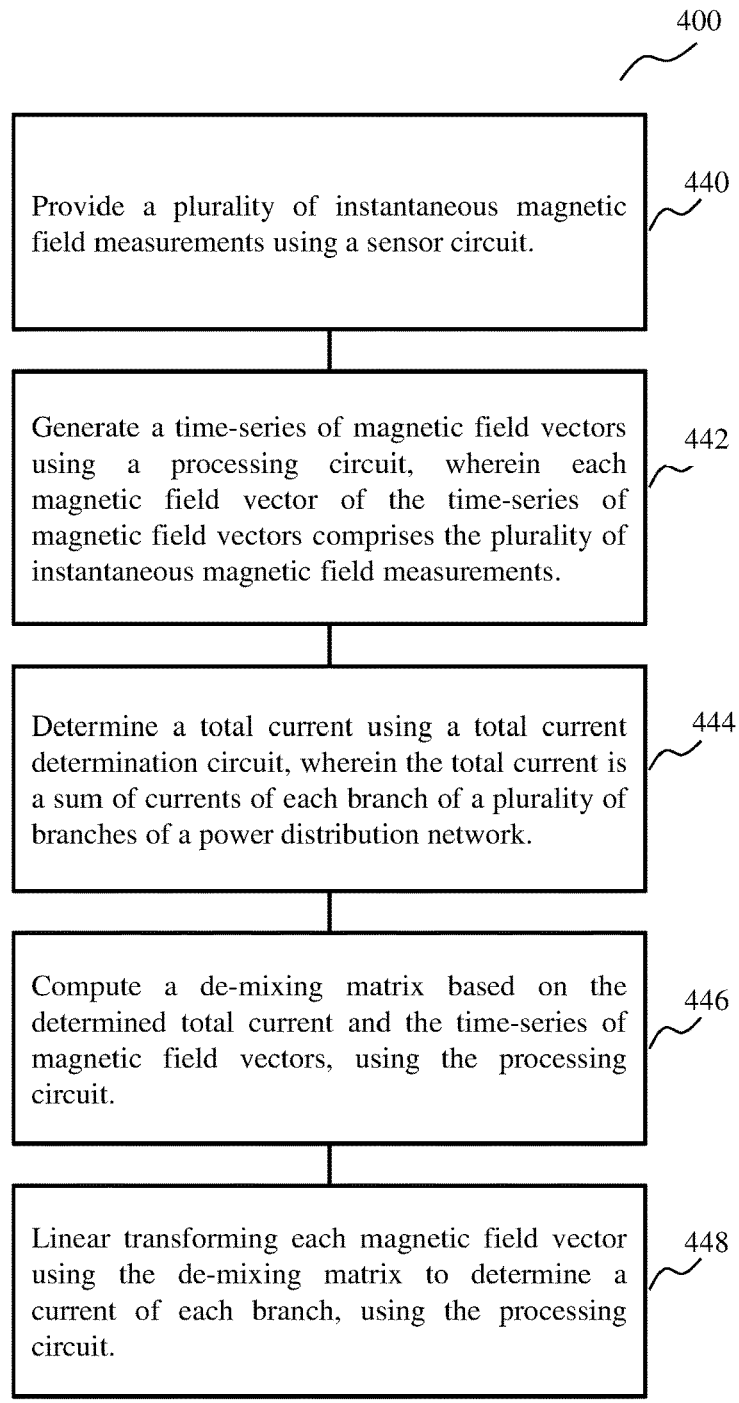
FIG. 4 shows a flow diagram of a method of providing branch-level measurements for a power distribution network, in accordance to various embodiments.

FIG. 4 shows a flow diagram 400 showing a method of providing branch-level measurements for a power distribution network, in accordance to various embodiments. In 440, a plurality of instantaneous magnetic field measurements may be provided using a sensor circuit. In 442, a time-series of magnetic field vectors may be generated using a processing circuit. Each magnetic field vector of the time-series of magnetic field vectors may include the plurality of instantaneous magnetic field measurements. In 444, a total current may be determined using a total current determination circuit. The total current may be a sum of currents of each branch of a plurality of branches of a power distribution network. Each instantaneous magnetic field measurement of the plurality of instantaneous magnetic field measurements may be a measurement of a sum of magnetic fields resulting from a subset of the plurality of branches. In 446, a de-mixing matrix may be computed based on the determined total current and the time-series of magnetic field vectors, using the processing circuit. In 448, each magnetic field vector may be linear transformed using the de-mixing matrix to determine a current of each branch, using the processing circuit.

The electric meter according to various embodiments, measures the electricity usage on individual branches of a power distribution network, beyond the aggregated readings of a master meter. The electric meter may be used to monitor current and power consumption in building environments at a granular scale. The electric meter provides a low-cost and convenient way of obtaining per-branch current and power readings of a power distribution network, as the electric meter may be installed on existing electricity distribution panels, in other words, electricity distribution boards, in a less intrusive way as compared to existing electric meters. The electric meter may include magnetic field sensors configured to measure the magnetic fields near an electricity distribution panel, to provide information that could be used to determine the per-branch current readings. The electric meter may alleviate the need to open an electricity distribution panel for installation, and provide a non-invasive electric metering system that could determine the electricity consumption of a building at a granular scale, for example, at a branch-level scale.

The magnetic field sensor readings of the electric meter may depend on the installation setup. Several parameters of the installation setup, such as displacement distance between the magnetic field sensors and conductors of the electricity current flow, and the orientations of the magnetic field sensors relative to the conductors in the electricity distribution panel, may affect the magnetic field sensor readings. The physical routing of wires in a typical electricity distribution panel may make it difficult to predetermine the necessary system parameters before the actual installation. The necessary system parameters may include how the magnetic field sensor readings should be mapped to the per-branch current readings. An electricity distribution panel typically has a plurality of miniature circuit breakers (MCBs) densely packed at less than 1 inch apart between each MCB, so the magnetic field near the surface of a distribution panel may be simultaneously influenced by the currents flowing through multiple neighboring branches. Hence, one key aspect of the proposed electric meter incorporates a method that may automatically estimate the system parameters based on the inherent properties of the power consumptions. The electric meter may include a plurality of compact magnetic sensors arranged into an array. The magnetic field sensors used in the electric meter may have sensitivity levels that are sufficiently high so that the magnetic field sensors may sense the magnetic field near the electric distribution panel without a need for external coils or a need to be installed inside the electricity distribution panel. The electric meter may be installed by simply placing its array of magnetic field sensors on top of the electricity distribution panel. The magnetic field signals captured by the sensors in the array may exhibit a linear relationship with the instantaneous per-branch currents. The properties of the sensor readings may be used by the electric meter to determine automatically the linear relationship between the magnetic field measurements and the per-branch currents. With the linear relationship known, the per-branch current readings of an electricity distribution panel may be determined with the magnetic field measurements from an array of magnetic field sensing elements placed near the electricity distribution panel. The installed system may not need to interfere with an original electricity distribution setup.

Figure 5:
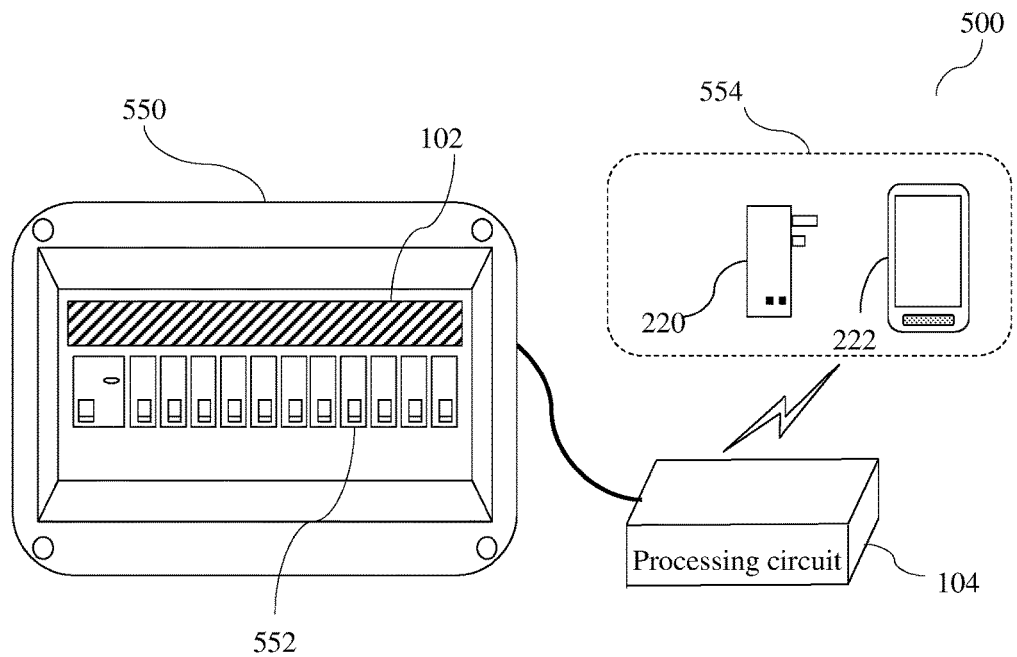
FIG. 5 shows a schematic diagram of an electric meter deployed over an electricity distribution board.

FIG. 5 shows a schematic diagram 500 of an electric meter deployed on an electricity distribution board 550, according to various embodiments. A power distribution network may be implemented in the form of the electricity distribution board 550. The electricity distribution board 550 may divide an electrical power feed into subsidiary circuits, in other words, a plurality of branches, while providing a circuit-breaker 552 for each branch of the plurality of branches. The number of circuit-breakers 552 may represent the number of branches in the power distribution network. The electric meter may include a sensor circuit 102, a processing circuit 104 and a plurality of peripheral devices 554. The electric meter may also include a total current determination circuit and an attachment member, which are not shown in FIG. 5. The electric meter may be deployed over the electricity distribution board 550 in a non-invasive manner, by attaching the sensor circuit 102 on a surface of the electricity distribution board 550 using the attachment member. The electricity distribution board 550 need not be opened up or disassembled to install the electric meter. The electricity distribution board 550 may have a row of miniature circuit-breakers (MCBs) 552 positioned on the electricity distribution board 550. The sensor circuit 102 may be positioned on an external surface of the electricity distribution board 550, near to the row of MCBs 552. The peripheral devices 554 may include a measurement device 220 which may be configured to gather information about an aggregated current, in other words, a total current that flows into the electricity distribution board 550. The measurement device 220 may thus provide a measurement of the total current consumed by the plurality of branches of the power distribution network. The measurement device 220 may also provide voltage readings, together with information on the phase of the voltage, corresponding to the total current. The peripheral devices 554 may further include a user interface 222 configured to enable user interaction with the electric meter.

The measurement device 220 may provide information on the total current to the total current determination circuit, which in turn, provides the information on the total current to the processing circuit 104. The processing circuit 104 may also receive magnetic field measurement data from the sensor circuit 102. The processing circuit 104 may then compute a mixing matrix which contains information on the linear relationship between the magnetic field corresponding to each branch of the electricity distribution board and the electric current in each branch. The magnetic field corresponding to a branch may be a sum of magnetic fields resulting from a subset of the plurality of branches. The processing circuit 104 may further compute a de-mixing matrix based on the mixing matrix, and use the de-mixing matrix to determine the current in each branch of the electricity distribution board. The processing circuit 104 may be configured to transmit information on the current in each branch, to the user interface 220.

Figure 6:
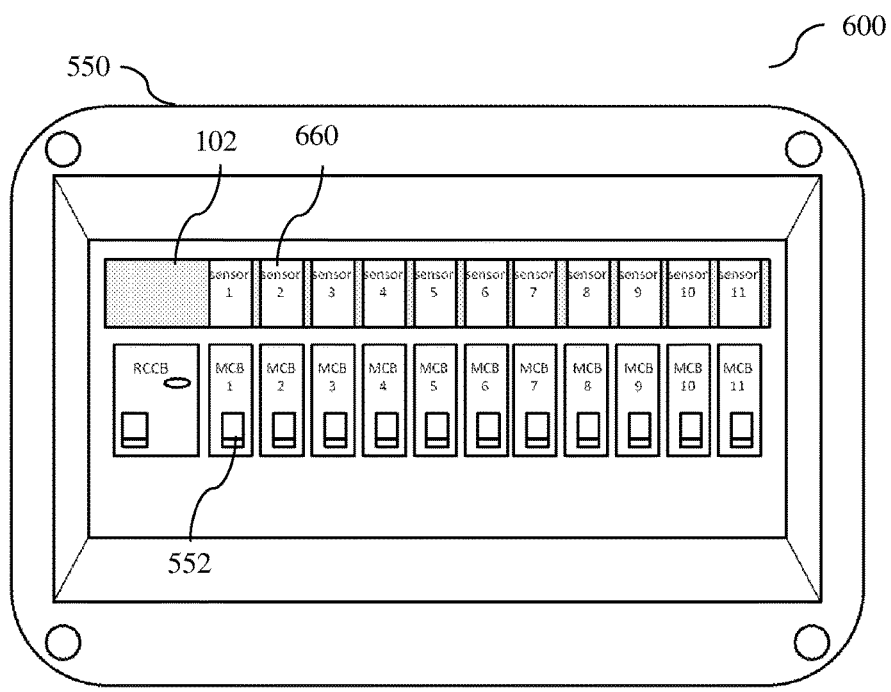
FIG. 6 shows a sensor circuit of an electric meter deployed over an electricity distribution board, in accordance to various embodiments.

FIG. 6 shows a diagram 600 showing a sensor circuit 102 mounted on an electricity distribution board 550, in accordance to various embodiments. The sensor circuit 102 may include a plurality of magnetic field sensing elements arranged as a sensor array. Each magnetic field sensing element may include a magnetic field sensor 660. The magnetic field sensor 662 may be an anisotropic magnetoresistance (AMR) sensor. The magnetic field sensor 662 may be a MEMS magnetic field sensor, so that the sensor circuit 102 may be a physically small package which may be easily attached onto the electricity distribution board 550. The number of magnetic field sensors 660 may be at least the same as the number of MCBs 552 in the electricity distribution board 550 to be monitored. In other words, as the number of MCBs 552 corresponds to the number of branches in the power distribution network, the sensor circuit 102 may have at least the same number of magnetic field sensors 660 as the number of branches in the power distribution network to be monitored. The sensor circuit 102 may be positioned on the electricity distribution board 550 such that each magnetic field sensor 660 is positioned in a vicinity of a unique MCB 552. In other words, a respective magnetic field sensor 660 may be positioned within a vicinity of each MCB 552. For example, as shown in FIG. 6, the magnetic field sensors 660 may be arranged in an array formation along the same axis as the array of the MCBs 552. The array formation of magnetic field sensors 660 may be parallel to the row of MCBs 552. Each magnetic field sensor 660 may be positioned such that its sensing axis can capture the magnetic field generated by electricity sub-flows corresponding to MCBs 552. For example, as shown in FIG. 6, magnetic field sensor 1 is positioned in a vicinity of MCB 1 and magnetic field sensors 2 to 11 are each positioned in a vicinity of MCBs 2 to 11, respectively.

Figure 7:
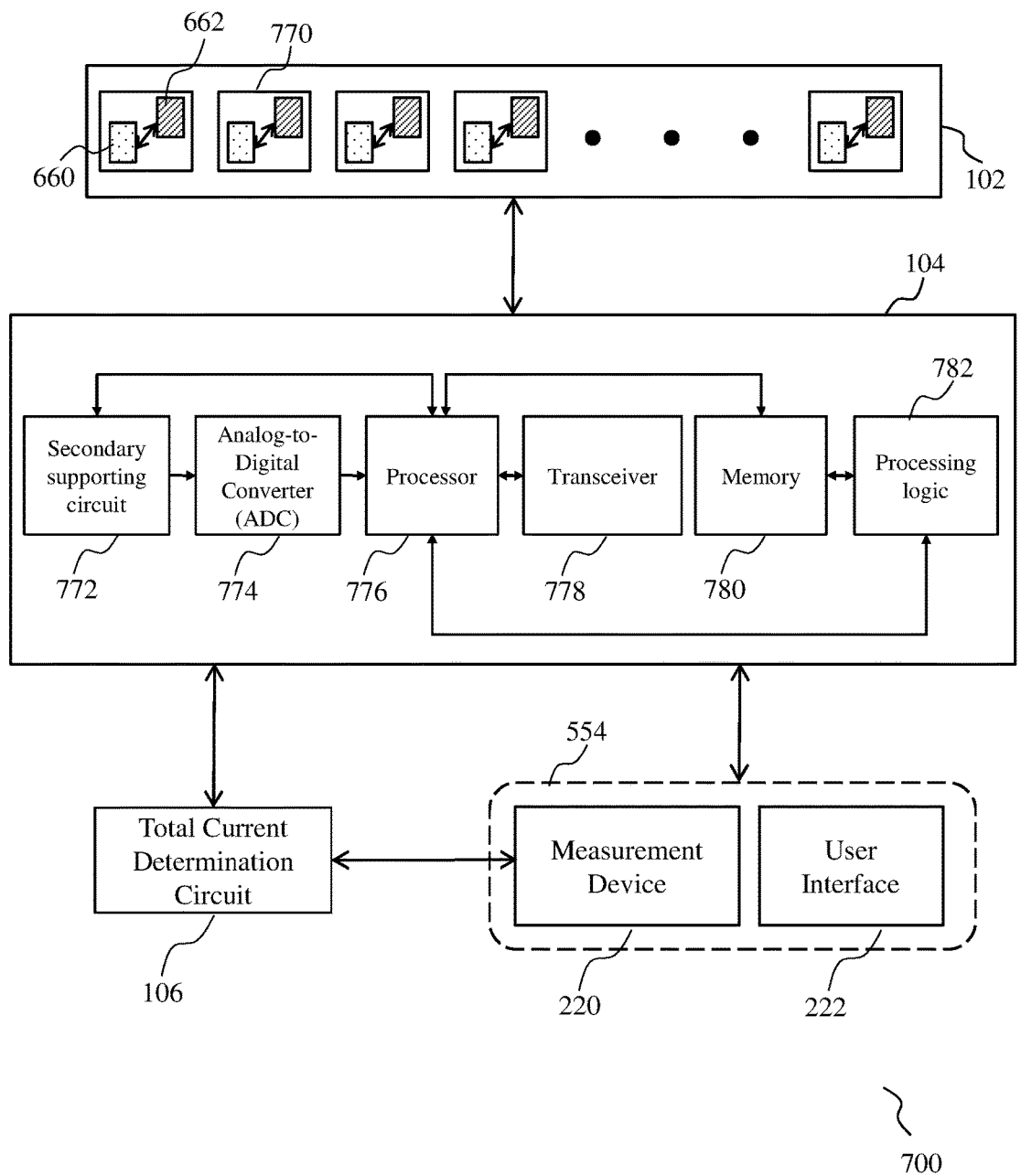
FIG. 7 shows a block diagram of an electric meter in accordance to various embodiments.

FIG. 7 shows a block diagram 700 of an electric meter in accordance to various embodiments. The electric meter may be positioned on an electricity distribution board to determine electric currents of each sub-flow of the electricity distribution board. The electricity distribution board may split an electricity flow into a plurality of sub-flows. Each sub-flow of the plurality of sub-flows may correspond to one branch of the plurality of branches of the power distribution network. Each branch may go through its corresponding circuit-breaker. The electric meter may provide meter readings for the individual sub-flows corresponding to the plurality of branches. The meter readings may provide information on at least one of an electric current or power consumption of each branch of the plurality of branches. The electric meter may include a sensor circuit 102, a processing circuit 104 and a total current determination circuit 106. The electric meter may further include at least one peripheral device 554.

The sensor circuit 102 may include a plurality of sensing elements 770, each of which may include a magnetic field sensor 660 and a supporting circuit 662. The magnetic field sensor 660 and the supporting circuit 662 within each sensing element 770 may be electrically coupled to each other. The sensor circuit 102 may be configured to send magnetic field measurements to the processing circuit 104. The sensor circuit 102 and the processing circuit 104 may be integrated as a single piece of hardware that may be mountable on a surface of an electricity distribution box.

The processing circuit 104 may include a secondary supporting circuit 772. The secondary supporting circuit may be configured to process analog signals received from the sensing circuit 102. The analog signals contain information on the magnetic fields sensed by the magnetic field sensors 660. The processing circuit 104 may further include an analog-to-digital converter (ADC) 774, a processor 776, a transceiver 778, a memory 780 and a processing logic 782. The ADC 774 may be configured to receive processed analog signals from the secondary supporting circuit 772, and further configured to convert the processed analog signals to digital signals. The processor 776 may be configured to receive the digital signals from the ADC 774. The processor 775 may be configured to at least one of generate magnetic field vectors, compute a de-mixing matrix or linear-transforming the magnetic field vectors, based on the processing logic 782. The transceiver 778 may be a radio device configured to transmit and receive signals between the processing circuit 102 and the at least one peripheral device 554. The memory 780 may be a storage device including at least one of a hard disk, a non-volatile memory, or a volatile memory. The memory 780 may be configured to store data relating to at least one of the magnetic field measurements or the processing logic 782. The processing logic 782 may be a circuit configured to determine a current of each branch. The processing logic 782 may also be a plurality of instructions. The plurality of instructions, when executed by a processor, may be configured to determine a current of each branch. The processing logic 782 may be a software module that is configured to run on the processor 776.

The at least one peripheral device 554 may include a measurement device 220 and a user interface 222. The measurement device 220 may be configured to measure at least one of a total current or a total voltage and further configured to provide information on the total current to the processing circuit 104 through the total current determination circuit 106. The measurement device 220 may be a smart meter, a current sensor or a voltage sensor. The measurement device 220 may be a stand-alone external device or it may be integrated into the electric meter or integrated into an electricity distribution board. The total current determination circuit 106 may receive the information on the total current from the measurement device 220, through at least one of a wired or wireless communication with the measurement device 220. The user interface 222 may be configured to enable user interactions with the electric meter. The user interface may be a portable handheld device, such as a smart phone that is configured to communicate with the processing circuit 104 through wireless communications. The processing circuit 104 may transmit information on a current of a branch to the user interface 222 which may then display the information on a screen. The user interface 222 may be a passive device configured to display electricity usage information. The user interface 222 may also be an interactive device for a user of the electric meter to access a database of power consumption data as collected by the electric meter. The user interface 222 may also serve as a maintenance tool for a technician to input configuration settings for the electric meter, or to troubleshoot the electric meter. The processing circuit 104 may be configured to at least one of transmit signals to the peripheral devices 554 or receive signals from the peripheral devices 554 using the transceiver 778. Each peripheral device 554 may also include a peripheral transceiver configured to at least one of transmit signals to or receive signals from the processing circuit 104.

Figure 8:
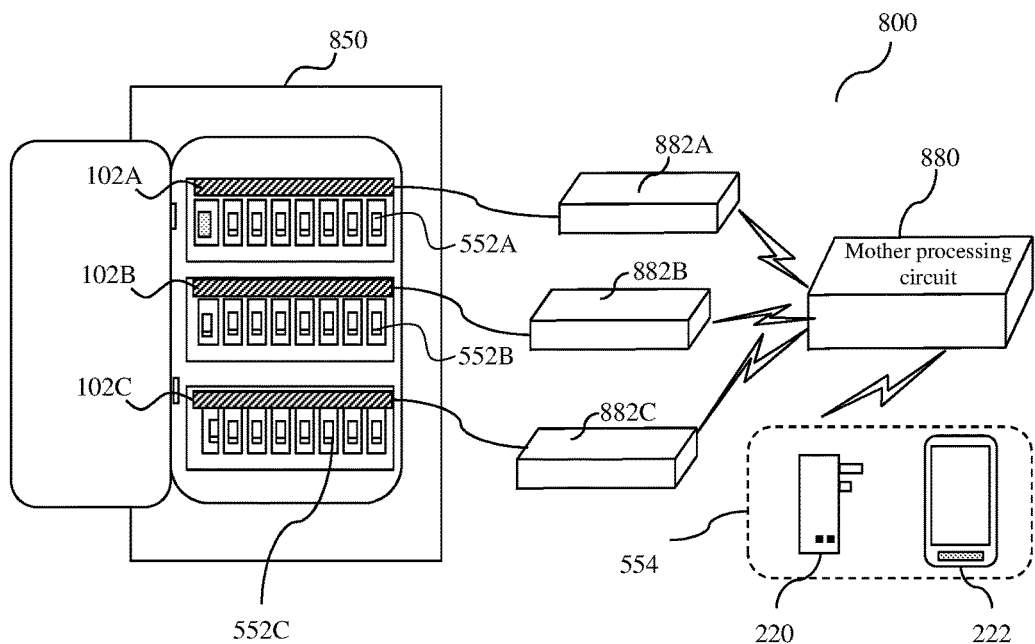
FIG. 8 shows a schematic diagram of an electric meter system deployed over an electricity distribution board, in accordance to various embodiments.

FIG. 8 shows a schematic diagram 800 showing an electric meter system deployed on an electricity distribution board 550, in accordance to various embodiments. The electric meter system may include a plurality of sensor circuits, namely a first sensor circuit 102A, a second sensor circuit 102B and a third sensor circuit 102C. Each sensor circuit may be deployed in a vicinity of a group of MCBs, for example, in the case of a multi-row electricity distribution board 850, the first sensor circuit 102A may be positioned near to a first row of MCBs 552A, the second sensor circuit 102B may be positioned near to a second row of MCBs 552B while the third sensor circuit 102C may be positioned near to a third row of MCBs 552C. The electric meter system may further include a daughter processing circuit electrically coupled to each sensor circuit. Each sensor circuit and its respective daughter processing circuit may be integrated as a daughter board, in a single piece of hardware. Similar to the deployment of an electric meter, as shown in FIG. 5, the electric meter system may be deployed over the electricity distribution board 850, in a non-invasive manner. Each sensor circuit may be attached or mounted onto a surface of the electricity distribution board 850 at a position near to a corresponding group of MCBs. The electricity distribution board 850 need not be opened up or disassembled for installation of the electric meter system.

Each daughter processing circuit 882 may be configured to receive magnetic field measurements from a respective sensor circuit 102. As shown in FIG. 8, a daughter processing circuit 882A may be coupled to the sensor circuit 102A, while a daughter processing circuit 882B may be coupled to the sensor circuit 102B and a daughter processing circuit 102C may be coupled to the sensor circuit 102C. The plurality of daughter processing circuits 102A-102C may be configured to partially process the magnetic field measurements received from their respective sensor circuits, and may be further configured to process the magnetic field measurements. Unlike the processing circuit 104 of FIG. 5, the daughter processing circuits may not fully process the magnetic field measurements to determine the current of each branch. Instead, the daughter processing circuits may be configured to partially process the magnetic field measurements and may be configured to send the partially processed data to the mother processing circuit 880. The mother processing circuit 880 may be configured to receive the partially processed data and may be further configured to determine the current of each branch, based on the partially processed data. The electric meter system may further include at least one peripheral device 554. The peripheral device 554 may include a measurement device 220 and a user interface 222. The mother processing circuit 880 may receive information on a total current of the electricity distribution board from the measurement device 220 through a total current determination circuit. The mother processing circuit 880 may make use of the information on the total current to compute the current of each branch. The mother processing circuit may also send information on the current of each branch, to the user interface 222, for displaying to a user.

Figure 9:
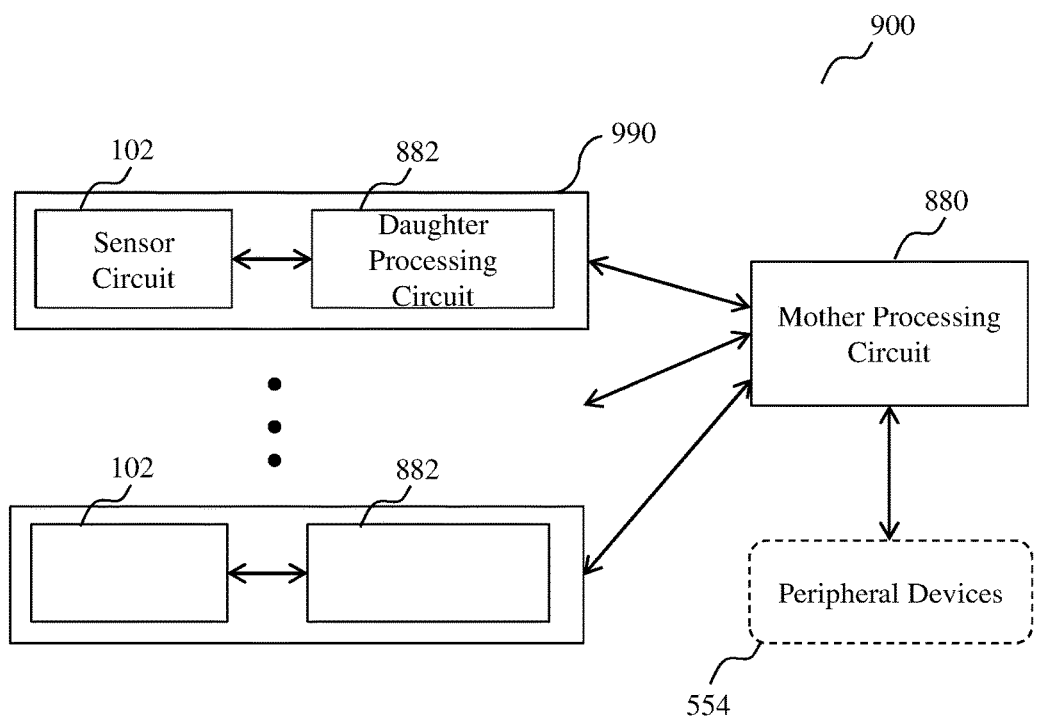
FIG. 9 shows a block diagram of the electric meter system of FIG. 8.

FIG. 9 shows a block diagram 900 of the electric meter system of FIG. 8. The electric meter system may include a plurality of daughter boards 990, a mother processing circuit 880 and at least one peripheral device 554. Each daughter board 990 may include a sensor circuit 102 and a daughter processing circuit 882. The daughter board 990 may be considered to be an electric meter similar to the electric meter of FIG. 1. Each daughter processing circuit 882 may be configured to receive magnetic field measurements from a respective sensor circuit 102 and further configured to provide a partially processed data. Each daughter processing circuit 882 may be configured to send the partially processed data to the mother processing circuit 880 through at least one of a wireless or a wired communications channel. The peripheral devices 554 may include a measurement device and a user interface. The mother processing circuit 880 may be configured to receive the partially processed data from the plurality of daughter processing circuits 882 and further configured to receive information on a total current from the measurement device. The mother processing circuit 880 may also be configured to communicate with the user interface to enable user interaction with the electric meter system. The communication between the mother processing circuit 880 and the peripheral devices 554 may be conducted through at least one of a cable or through wireless signals such as radio frequency communications.

Figure 10:
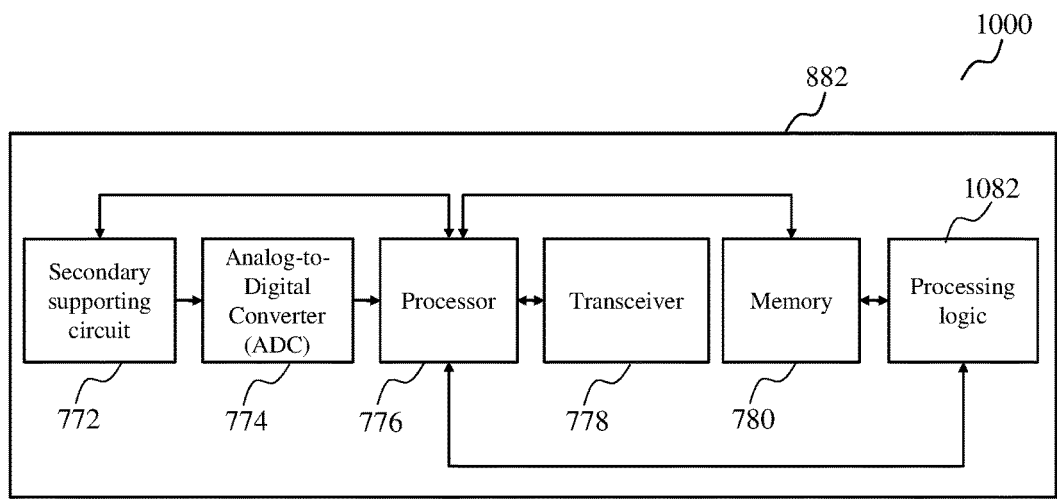
FIG. 10 shows a block diagram of a daughter processing circuit of an electric meter system, in accordance to various embodiments.

FIG. 10 shows a block diagram 1000 of a daughter processing circuit 882, in accordance to various embodiments. The daughter processing circuit 882 may be similar to a processing circuit 104 of an electric meter, in that it includes a secondary supporting circuit 772, an ADC 774, a processor 776, a transceiver 778, a memory 780 and a processing logic 1082. The secondary supporting circuit may be configured to process analog signals received from the sensing circuit 102. The analog signals contain information on the magnetic fields sensed by the sensor circuit. The ADC 774 may be configured to receive processed analog signals from the secondary supporting circuit 772, and further configured to convert the processed analog signals to digital signals. The processor 776 may be configured to receive the digital signals from the ADC 774, and further configured to process the digital signals based on the processing logic 1082. The transceiver 778 may be a radio device configured to transmit and receive signals between the daughter processing circuit 882 and a mother processing circuit 880. The memory 780 may be a storage device including at least one of a hard disk, a non-volatile memory, or a volatile memory. The memory 780 may be configured to store data relating to at least one of the magnetic field measurements or the processing logic 1082. The processing logic 1082 may be a plurality of instructions, when executed by a processor, may be configured to partially process the digital signals received from the ADC. The processing logic 1082 may be a plurality of instructions that are a subset of the processing logic 782 of the processing circuit 104 of FIG. 7. The processing logic 1082 may be a software module that is configured to run on the processor 776.

Figure 11:
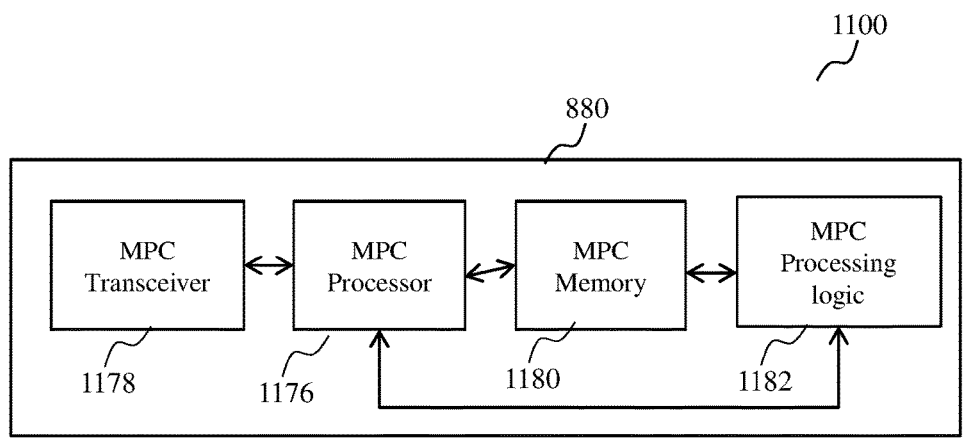
FIG. 11 shows a block diagram of a mother processing circuit of an electric meter system, in accordance to various embodiments.

FIG. 11 shows a block diagram 1100 of a mother processing circuit 880, in accordance to various embodiments. The mother processing circuit (MPC) 880 may include a MPC transceiver 1178, a MPC processor 1176, a MPC memory 1180 and a MPC processing logic 1182. The mother processing circuit 880 may be configured to receive partially processed data from the daughter processing circuits 882, through the transceiver 1178. The MPC transceiver 1178 may be a radio device configured to transmit and receive signals between the mother processing circuit 880 and the plurality of daughter processing circuits 882. The MPC memory 1180 may be a storage device including at least one of a hard disk, a non-volatile memory, or a volatile memory. The MPC memory 1180 may be configured to store data relating to at least one of the partially processed data or the MPC processing logic 1182. The MPC processing logic 1182 may be a plurality of instructions configured to determine the current of each branch based on the partially processed data and information on a total current of the electricity distribution board. The MPC processing logic 1182 may be a plurality of instructions that are a subset of the processing logic 782 of the processing circuit 104 of FIG. 7. The plurality of instructions, when executed by a processor, may be configured to determine the current of each branch based on the partially processed data and information on a total current of the electricity distribution board. The MPC processing logic 1182 may be a software module that is configured to run on the MPC processor 1176.

Figure 12:
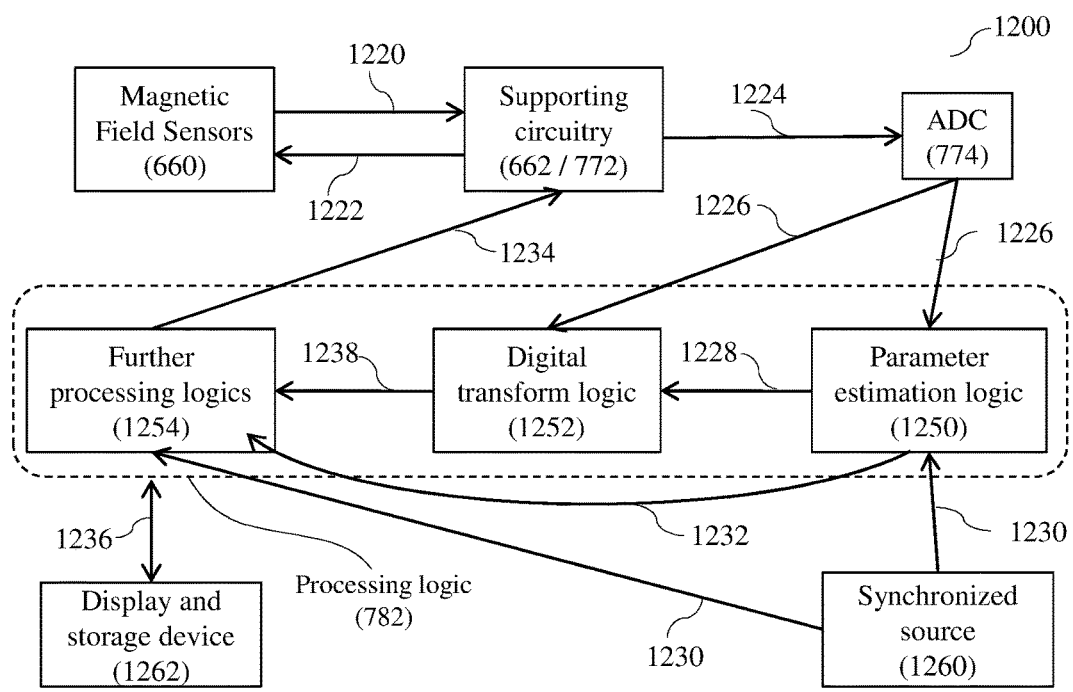
FIG. 12 shows a block diagram showing an information flow among components of an electric meter or an electric meter system, in accordance to various embodiments.

FIG. 12 shows a block diagram 1200 showing an information flow among different components of an electric meter or an electric meter system, in accordance to various embodiments. The electric meter may include a sensor circuit including a plurality of magnetic field sensors 660, as well as a supporting circuit 662 coupled to each magnetic field sensor 660. The magnetic field sensors 660 may be arranged as a magnetic sensor array. The electric meter may further include a processing circuit including a secondary supporting circuit 772, an ADC 774 and a processor configured to run a processing logic 782. The ADC 774 may be a multi-channel ADC. The electric meter may further include a synchronized source 1260 and a display and storage device 1262. The synchronized source 1260 may be a measurement device. The synchronized source 1260 may also be a device configured to provide a measurement of a total current and a measurement of a total voltage. The display and storage device 1262 may be a user interface.

The magnetic field sensors 660 may be configured to produce differential voltages that are proportional to the magnetic fields that they measure. The analog signals 1220 from the magnetic field sensors 660 may be routed to supporting circuitry including the supporting circuit 662 and the secondary supporting circuit 772. Each supporting circuit 662 may include a signal conditioning circuit configured to function as a high pass filter. The secondary supporting circuit 772 may similarly include a signal conditioning circuit configured to function as a high pass filter. The high pass filter may filter out the earth's magnetic field and other low frequency stray interferences to provide an analog output signal 1224 to the ADC 774. Each supporting circuit 662 may also be configured to amplify the analog signal 1220 produced by the sensors, and may also shift a direct current (DC) level or remove a DC bias of the analog signals 1220. The secondary supporting circuit 772 may also be configured to at least one of amplify the analog signals 1220, shift a DC level of the analogs signal 1220 or remove a DC bias of the analog signals 1220. The processing of the analog signals 1220, such as the removal of noise, the amplification and the shifting of the DC level may result in analog output signals 1224 which may be converted to more accurate digital readings 1226. In addition, the supporting circuitry 662/772 may further include sensor control circuitry to ensure the correct operation of the magnetic field sensors 660. The sensor control circuitry may be configured to send sensor control signals 1222 to the magnetic field sensors 660, for example, to reset the magnetic field sensors 660. The sensor control circuitry may include a reset circuitry for AMR sensors.

The distribution of functionalities between the supporting circuit 662 and the secondary supporting circuit 772 may be flexible. For example, the supporting circuit 662 may be configured to amplify analog signals 1220 at a first level of amplification while the secondary supporting circuit 772 may be configured to amplify the analog signals 1220 at a second level of amplification. The first level of amplification and the second level of amplification may be dynamically adjustable by the supporting circuit 662 and the secondary supporting circuit 772 respectively. The analog output signals 1224 provided by the supporting circuitry 662/772 may then be sampled by the ADC 774 to generate synchronized digital readings 1226. The digital readings 1226 may be streamed to the processing logic 782 residing in the processing circuit. The processing logic 782 may include a parameter estimation logic 1250, a digital transform logic 1252 and various further processing logics 1254.

Signals measured by an individual magnetic field sensor 660 may be indicative of the magnetic fields generated by a plurality of sub-flows corresponding to a plurality of branches. Hence, the signal measured by an individual magnetic field sensor 660 may be an instantaneous linear mixture of magnetic field values from the plurality of sub-flows. The parameter estimation logic 1250 may estimate a de-mixing matrix 1228 required to segregate the linear signal mixture into individual components for each branch of the plurality of branches. The parameter estimation logic 1250 may estimate elements of the de-mixing matrix 1228 based on inherent properties of the magnetic field sensor readings 1226 and an aggregated reading 1230 provided by the synchronized source 1260. The aggregated reading 1230 may be at least one of a total current or a total voltage of the power distribution network. The synchronized source 1260 may be external to the electric meter.

The digital transform logic 1252 may use the de-mixing matrix 1228 to perform a linear transformation of the synchronized instantaneous digital readings 1226, resulting in per-branch current readings 1238. The per-branch current readings 1238 provide information on the current of each branch of the power distribution network. The per-branch current readings 1238 may be further processed by the further processing logics 1254, for example, to be combined with voltage readings with phase information from the aggregated readings 1230, to estimate per-branch power consumption, power factor, and other power related parameters. In addition, the further processing logics 1254 may also detect per-branch current estimation errors and various types of system anomalies by cross checking information (1230, 1232, and 1238) from other components, and may send out control commands 1234 to the supporting circuitry 662/772 when necessary. For example, it may command the supporting circuitry 662/772 to reset the magnetic field sensors 660 when it detects inaccurate sensor readings.

For the electric meter system of FIG. 8, the distribution of processing logic 782 between the mother processing circuit 880 and daughter processing circuits 882 may be flexible. For example, the processing logic 782 may be partially implemented in the mother processing circuit 880 and partially implemented in the daughter processing circuits 882, so as to spread out processing loads or to minimize overheads on the communication channel between the daughter processing circuits 882 and the mother processing circuit 880.

The processing logic 782 may also facilitate the user communication 1236 with a user of the electric meter, through a display and storage device 1262. The display and storage device 1262 may be the user interface. The processing logic 782 may send the per-branch power consumption information to the user interface for display. The user interface may also receive various inputs from the user to facilitate configuration of the electric meter. The user interface may then provide the various inputs from the user, to the processing logic 782.

The electric meter, in accordance to various embodiments, may include a sensor circuit including a magnetic sensor array. The magnetic sensor array may include a plurality of anisotropic magneto resistive (AMR) sensors. AMR sensors are low cost and have been widely used as magnetometers for measuring the earth's magnetic field. The sensitivity level of AMR sensors may be sufficient for being used in the electric meter. The number of AMR sensors in the sensor array may be no less than the number of branches in the electricity distribution board. For example, if the electric meter is intended to be used on an electricity distribution board with 10 branches, the sensor array may include at least 10 AMR sensors placed equidistantly. The distance between neighboring sensors may be equal to a width of miniature circuit breakers (MCBs) in the electricity distribution board. The supporting circuits may include a signal conditioning circuit which includes a high pass filter. The purpose of the high pass filter is to filter out the earth's magnetic field and other low frequency stray interferences from the sensor outputs. The circuitry may also amplify and perform level shifting of the differential outputs produced by the sensors to values, so that the analog signals may be directly sampled by the Analog-to-Digital Converter (ADC) later. The supporting circuits may also include a reset circuitry which sensitizes the AMR sensors when necessary.

A multi-channel ADC may be configured to sample the pre-processed signals from the plurality of sensors simultaneously, to provide digitized sensor readings. The digitized sensor readings may be fed into two digital processing blocks, namely, the parameter estimation block and the digital transform block. The parameter estimation block may leverage the sensor readings to determine various necessary system parameters. In particular, the magnetic field signals captured by the sensors in the array exhibit a linear relationship with the instantaneous per-branch currents. The proposed estimation method may use the properties of the sensor readings to automatically determine this linear relationship and output it in the form of a de-mixing matrix. For this purpose, the estimation method may also leverage information about the total current consumption of the electricity distribution panel and voltage, which may be obtained from an external source. In the devised estimation method, sensor readings that satisfy certain criteria may be used to determine the values of the elements in the de-mixing matrix. As an illustrating example, in one of the simplest cases, when the estimation method determines that the change of the current value in a particular branch dominates the simultaneous changes happened to all other branches, the relative changes measured by different sensors may be used to determine the corresponding coefficients in the de-mixing matrix. The information about the total current consumption in the electricity distribution panel and the voltage may be used to estimate the system parameters. The information about the total current consumption may be obtained from external sources, which could be corresponding smart meters, or any other sensor devices that measure the required information. A digital transform block may use the sensor readings and the de-mixing matrix to recover the per-branch current readings. Further processing may be performed to better provide the intended functionalities to end users. The further processing may include but may not be limited to, the computation of power consumption based on the current and voltage information, the aggregation of current and/or power readings to more concise root mean square values before transmitting to external devices, and various control commands to adjust the sensor arrays and the supporting circuits for better measurement qualities. The obtained information may be displayed to users through external devices, for example, an in-home display or mobile devices or smart phones, and stored in convenient media devices such as a personal computer or a computing cloud.

In the following paragraphs, methods of estimating necessary parameters for an electric meter or an electric meter in accordance to various embodiments, is described. The estimation of the necessary parameters may be performed by the processing circuit of the electric meter or in at least one of the daughter processing circuits or the mother processing circuit of the electric meter system.

Electric meters or sub-meters may be used to measure the electricity usage on individual branches of a power distribution network beyond a master meter. By standard practice, the main electric flow may be split into different branches at an electricity distribution board, where each branch may be routed through a corresponding circuit breaker. For an electricity distribution board with n branches, the proposed system uses m magnetic sensors that are placed at multiple locations on the surface of the board, where (m≥n). The magnetic sensors may be configured to sample the instantaneous magnetic fields around the distribution board at a relatively high sampling rate, for example, in the order of a few KHz to a few dozen KHz. The magnetic sensor readings may then be used to estimate the per-branch electric current readings, which in turn may be combined with voltage readings to compute various electricity usage metrics, including power, power factor, and energy. The proposed parameter estimation methods find the necessary parameters that may be used to estimate per-branch electric current readings based on the magnetic sensor readings. For each of the n circuit breakers of the electricity distribution board, which corresponds to each of the n branches, one sensor may be placed immediately next to it. The sensor may be placed such that its sensing axis effectively captures the magnetic field generated by the electric current corresponding to the nearest branch. The proposed methods leverage the following properties of the electric meter and the electricity distribution board:

The first property, also referred to herein as property 1, may be as follows: the magnetic field measured by a sensor is the sum of the magnetic field induced by external environment (for example, the earth's magnetic field) and the magnetic fields induced by the electric currents that flow through nearby conductors, where at least one conductor corresponds to the branch that is closest to the sensor.

The second property, also referred to herein as property 2, may be as follows: a conductor in the electricity distribution board either carries electric current corresponding to certain branch, or corresponding to the sum of the electric currents of some or all branches.

The third property, also referred to herein as property 3, may be as follows: the strength of the magnetic field induced by a conductor is proportional (with a constant coefficient) to the instantaneous electric current that flows through the conductor.

The fourth property, also referred to herein as property 4, may be as follows: one unit of electric current through a branch incurs stronger magnetic field at the sensor placed closest to it than at other sensors.

The fifth property, also referred to herein as property 5, may be as follows: the impact of external magnetic field (e.g., from the earth) may be filtered out through the removal of the DC component of the reading of a magnetic sensor.

The sixth property, also referred to herein as property 6, may be as follows: the sum of the per-branch electric currents equals to the total electric current of the whole electricity distribution board.

The above six properties together lead to the fact that the alternating current (AC) component of the magnetic field that a sensor measures is an instantaneous linear mixture of the electric currents of the branches of the panel. Specifically, for time t, the instantaneous magnetic sensor measurement vector, also known as a magnetic field vector, $S(t) \in \mathcal{R}^m$ of the m magnetic sensors (after the removal of their direct current (DC) components) may be written as a linear transformation of the instantaneous electric current vector $I(t) \in \mathcal{R}^n$ of the n branches, as denoted by:

$$S(t)=AI(t) \qquad \text{[Equation 1]}$$

FIG. 13 shows an example of the linear relationship between an instantaneous magnetic field vector and a corresponding instantaneous electric current vector. The instantaneous magnetic field vector, or otherwise known as the instantaneous magnetic sensor measurement vector, for m=3 sensors at some time t, is denoted as 1332. The corresponding instantaneous electric current vector I(t) of the n=3 branches, is denoted as 1336. The mixing matrix A is denoted as 1334. The mixing matrix $A \in \mathcal{R}^{m \times n}$ 1334 depends on the installation setup, which includes the wiring set up of the electricity distribution board and the relative position of each sensor and the orientation of each sensor to the nearby conductors. $I_j(t)$ denotes the $j^{th}$ element of the column vector I(t), in other words, the electric current of the $j^{th}$ branch at time t. $S_j(t)$ denotes the $j^{th}$ element of the column vector S(t), in other words, the measurement of the $j^{th}$ sensor at time t after the removal of its DC component. If the mixing matrix A is known and has full column rank, the electric current vector I(t) may be computed by:

$$I(t)=A^\dagger S(t) \qquad \text{[Equation 2]}$$

where $A^\dagger=(A^TA)^{-1}A^T$ is the (pseudo) inverse of A, and is the de-mixing matrix. This leads to a first requirement.

The first requirement, also referred to herein as requirement 1, may be as follows: the placement of the sensors results in a mixing matrix A of full column rank. In practice, this requirement can often be achieved, for example, by placing one sensor close to each of the n circuit breakers as shown in FIG. 6. To compute the electric current vector I(t) as in Equation 2, the mixing matrix A needs to be known. However, since the mixing matrix A depends on the installation setup, it is often difficult to pre-determine the values of the elements in A.

The following paragraphs describe two parameter estimation methods, which estimate the mixing matrix A of the system. Both methods have a second requirement. The second requirement, also referred to herein as requirement 2, may be as follows: information about the total electric current $i_{total}$ is available as an input, where:

$$i_{total}(t) = 1 \times I(t) \qquad \text{[Equation 3]}$$

where 1 is an n-element row vector of 1s.

The total electric current information may be obtained either from an in-situ main power meter, or by applying invasive or non-invasive electricity measurement methods over the main conductor of the electricity distribution board. The magnetic sensor and total electric current measurements may also contain noises, which are not considered below to simplify the discussion.

The estimation methods leverage the sensor signals to estimate the necessary system parameters. The electric meter then estimates the per-branch current and power readings of an electricity distribution board, based on the sensor signals and the estimated system parameters.

The first method is the dominating-branch-based method. The $k^{th}$ branch is the dominating branch at time t if for time t, the $k^{th}$ branch is the single branch that has active loads, i.e.:

$$\begin{cases} I_k(t) \neq 0 \\ I_j(t) = 0 \text{ for } j \neq k \end{cases} \qquad \text{[Equation 4]}$$

S(t), $i_{total}$(t) and k may be used to estimate the $k^{th}$ column of the mixing matrix A. Specifically, for $j \in \{1, \ldots, m\}$:

$$A_{j,k} = S_j(t)/i_{total}(t) \qquad \text{[Equation 5]}$$

Similarly, consider the difference between two time moments $t_1$ and $t_2$. The $k^{th}$ branch is the dominating branch between the two times moments $t_1$ and $t_2$ if the $k^{th}$ branch is the single branch that has a load change between the two moments, i.e.:

$$\begin{cases} I_k(t_1) - I_k(t_2) \neq 0 \\ I_j(t_1) - I_j(t_2) = 0 \text{ for } j \neq k \end{cases} \qquad \text{[Equation 6]}$$

Then, the $k^{th}$ column of the mixing matrix A may be estimated. Specifically, for $j \in \{1, \ldots, m\}$:

$$A_{j,k} = \frac{S_j(t_1) - S_j(t_2)}{i_{total}(t_1) - i_{total}(t_2)} \qquad \text{[Equation 7]}$$

FIG. 14 shows an example of using the dominating-branch-based method to estimate the second column of the mixing matrix, when the second branch is the dominating branch. A first vector 1432 is the instantaneous magnetic field vector at a time instance when the second branch is the dominating branch. A first matrix 1334 is the mixing matrix. A second vector 1436 is the instantaneous current vector at the time instance when the second branch is the dominating branch.

The voltage of an alternating current (AC) electric grid system changes periodically, usually with a frequency f=50 Hz or f=60 Hz. The usual waveform of the electric grid AC voltage is a sine wave, which may be expressed as a function of time (assuming a starting phase of 0), v(t)=$v_{peak}$ sin(2πft). The voltage waveform repeats itself every $$\frac{1}{f}$$

second and all branches may see the same voltage waveform. If there is a constant electric load connected to a branch, the resulting electric current waveform in the branch also repeats itself every $$\frac{1}{f}$$

second. Hence, it may be useful to consider the measurement data in the unit of a $$\frac{1}{f}$$

second period.

An AC cycle may be denoted as a time interval of $$\left[ \frac{l}{f}, \frac{l+1}{f} \right)$$

for some non-negative integer l. For an AC cycle starting at time $$\frac{l}{f},$$

its electric current waveform may be expressed as a function $\tilde{i}(\theta)$ of radian $\theta \in [0, 2\pi)$, where $\tilde{i}(\theta)$ is the electric current value at time $$t = \frac{l}{f} + \frac{\theta}{2\pi f}.$$

Some common electric loads may produce electric current $\tilde{i}(\theta)$ that is not a pure sine wave, but contains higher harmonic components.

Similarly, the magnetic sensor array measurements in a given AC cycle may be denoted by a function $\tilde{S}(\theta)$ of $\theta \in [0, 2\pi)$. Here for $j \in \{1, 2, \ldots m\}$, $\tilde{S}_j(\theta)$ gives the reading of the $j^{th}$ magnetic sensor at the time $$t = \frac{l}{f} + \frac{\theta}{2\pi f}.$$

With this definition, considering two AC cycles with wave function of $\tilde{S}$ and $\tilde{S}'$ respectively, the difference between the two wave functions, i.e., $\tilde{S}-\tilde{S}'$ which is itself a function of $\theta \in [0, 2\pi)$, may be used to infer whether there is a load change between the two cycles. If $\tilde{S}-\tilde{S}'=0$, there is likely to be no load change between the two AC cycles.

The concept of dominating branch as defined previously regarding the measurement of various time points may be generalized to the measurement of AC cycles. Specifically, the $k^{th}$ branch is the dominating branch of an AC cycle if the $k^{th}$ branch is the single branch with non-zero electric current in the considered AC cycle. Similarly, the $k^{th}$ branch is the dominating branch between two AC cycles if the $k^{th}$ branch is the single branch with non-zero electric current change between the two considered AC cycles. To estimate the values of all elements in mixing matrix A based on dominating branch, a third requirement is needed. The third requirement, also referred to herein as requirement 3, may be as follows: every branch should be a dominating branch at some point in time or AC cycle; or between two times or two AC cycles. The third requirement may be fulfilled under some typical setups, including:

A first type of dominating-branch setup, also referred to herein as the dominating-branch setup 1, may be as follows: in a simplest setup, an installer may first turn off all branches, and then turn on each individual branch (with active load connected) one by one on its own. The branch being switched on will be the dominating branch. It should be noted that the effort for doing so is linear to the number of branches in the electricity distribution board.

A second type of dominating-branch setup, also referred to herein as the dominating-branch setup 2, may be as follows: at the AC cycle level (i.e., sub-second time granularity), if the loads in the system change infrequently and the changes of different branches happen in an asynchronous manner, Requirement 3 may be fulfilled with a high probability. As this approach requires each branch to be a dominating branch at least once, the observation may need to be carried out in days. For example, some lighting loads may be turned on and off only once a day.

Assuming Requirement 3 holds, to apply the dominant-branch-based approach, a method needs to be developed to identify the moments (cycles) when there is a dominating branch. Since the electric current vector I is unknown, the proposed method below uses the information of $\tilde{S}$ and $i_{total}$ to make such decisions.

Figure 15:
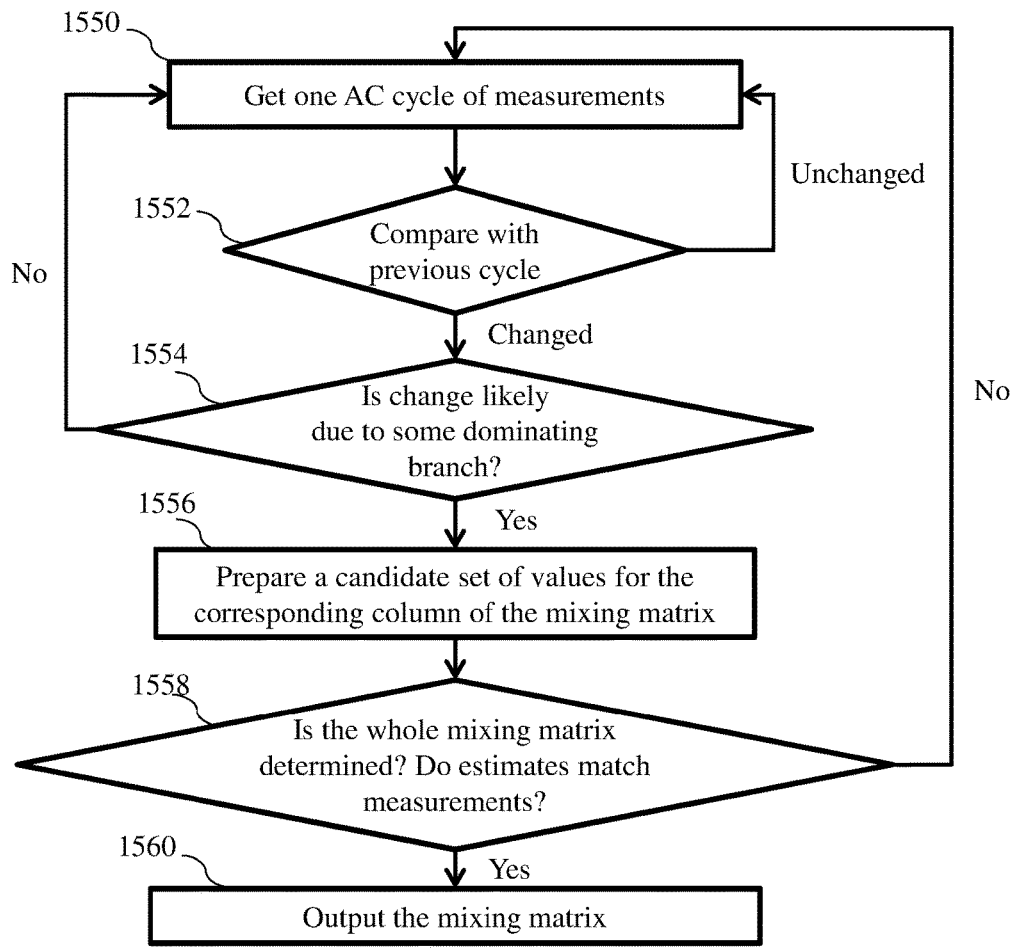
FIG. 15 shows a flow diagram showing a method of computing a mixing matrix using a dominant-branch-based method.

FIG. 15 shows a flow diagram 1500 showing a method of computing the mixing matrix for an electric meter, in accordance to various embodiments. The mixing matrix is used by the electric meter to compute a de-mixing matrix for the determination of the current vector. The flow diagram 1500 shows the main steps of a dominating-branch-based method. To simplify the following discussion without loss of generality, consider the case where m=n (i.e., the number of magnetic sensors is the same as the number of branches in the distribution board) and the $j^{th}$ magnetic sensor is placed closest to the circuit breaker of the $j^{th}$ branch. The method may be easily generalized to the case with m>n.

For each new AC cycle, the first step 1550 gathers the magnetic sensor measurement function $\tilde{S}$. The next step 1552 then computes the difference between $\tilde{S}$ and the magnetic sensor measurements $\tilde{S}'$ from the previous AC cycle. If there is some change, i.e., the function $\tilde{S}-\tilde{S}'\neq 0$, the next step 1554 checks whether the change is likely due to a dominating branch. This step 1554 first finds the sensor that observes the largest change of readings across the two AC cycles, by comparing the root mean square (RMS) values of the measurement differences of the sensors. The $k^{th}$ branch is selected as the candidate dominating branch, if the $k^{th}$ sensor, which is closest to the $k^{th}$ branch, has the greatest RMS value of the measurement difference among all sensors, i.e.:

$$\text{RMS}(\tilde{S}_k-\tilde{S}'_k) > \text{RMS}(\tilde{S}_j-\tilde{S}'_j), \text{for } \forall j \in \{1,2,\ldots m\}/\{k\}. \quad \text{[Equation 8]}$$

The step 1554 then checks the following necessary condition for the $k^{th}$ branch to be a dominating branch: for all branches $j \in \{1, 2, \ldots m\}$, the changes as measured by the magnetic sensors need to be linear with each other, i.e., there exists a constant scalar multiplier $x_j$ such that:

$$\tilde{S}_j-\tilde{S}'_j = x_j(\tilde{S}_k-\tilde{S}'_k) \quad \text{[Equation 9]}$$

If the above test fails, the method returns to the first step 1550 to gather more data. The pass of the above test is not a sufficient condition that the $k^{th}$ branch is indeed a dominating branch. Hence, this checking step 1554 uses a few heuristics to infer the likelihood that the $k^{th}$ branch is a dominating branch.

A first dominating-branch heuristic, also referred herein as the dominating-branch heuristic 1, may be as follows: examine for previous AC cycle measurements whether the measurements have been remaining unchanged for multiple cycles. If the answer is true, the method assigns a higher likelihood level for the decision that the change is due to a single dominating branch. This heuristic is based on the assumption that each load is independently alternating between a stable state and an unstable state, with the state transition happens relatively infrequently at the AC cycle level. Hence, the existence of multiple identical AC cycles implies that all loads have been in their stable states until the current AC cycle. Since each load changes states independently and infrequently, the current change is likely due to a single load enters into its unstable state.

A second dominating-branch heuristic, also referred herein as the dominating-branch heuristic 2, may be as follows: examine whether there is a dominating branch inferred from the previous cycle that is the same as the dominating branch inferred from the current cycle. If the answer is true, the likelihood of the current change is due to a dominating branch is set to high. The heuristic is based on the same intuition as above heuristic: the fact that the dominating branch determined by considering the previous cycle is the same as the dominating branch determined by considering the current cycle implies that the identified branch is likely the only branch in its unstable state.

A third dominating-branch heuristic, also referred to herein as the dominating-branch heuristic 3, may be as follows: examine the number of harmonic components in $\tilde{S}_k-\tilde{S}'_k$, this heuristic is based on the observation that when there are multiple harmonic components in $\tilde{S}_k-\tilde{S}'_k$, it is unlikely that concurrent changes of multiple loads in different branches can result in the dominating-branch necessary condition [Equation 9] being satisfied. In contrast, if $\tilde{S}_k-\tilde{S}'_k$ does not have higher harmonics, i.e., it is a sine wave, any number of changing branches can meet the dominating-branch necessary condition if they all have a sine wave shape.

If the checking step 1554 decides that the change is likely because the $k^{th}$ branch is the dominating branch, the next step 1556 computes the candidate values of $A_{j,k}$ for $j \in \{1, 2, \ldots m\}$ by scaling $x_j$ (from [Equation 9]) according to $i_{total}$, such that [Equation 7] is satisfied. These new set of values for $A_{j,k}$, together with their likelihood values computed from the checking step 1554, will be added into the candidate set of values for further consideration.

In the next step 1558, the method first checks whether some candidate value has been assigned to every element of the mixing matrix A. If yes, it then tests the mixing matrix candidate/candidates against the available measurement data. The test includes the checking of Property 6, i.e., whether the sum of the estimated per-branch electric currents (as computed by [Equation 2]) equals to the measured total electric current $i_{total}$ If there is a mixing matrix candidate that satisfies the test, it may be output at the final step 1560; otherwise, the method returns to the first step 1550 to continue gather new measurement data.

In summary, the processing circuit of the electric meter or at least one of the daughter processing circuits or the mother processing circuit of the electric meter system may be configured to identify the dominant branch. The dominant branch may be one of an only branch of a plurality of branches having a non-zero current or an only branch of the plurality of branches having a non-zero change in current. The processing circuit may be further configured to compute the mixing matrix based on a plurality of dominant branches, and then further configured to compute a de-mixing matrix based on the mixing matrix.

There may be setups where the Requirement 3 for a dominating-branch-based method cannot be satisfied. This can happen for example, when the manual switching of some branches by the installer is undesirable, or when there are some branches that change loads continuously across AC cycles. A constantly-changing branch can prevent any other branches from becoming dominating branch. For such setups, the dominating-branch-based method cannot output the mixing matrix A. The following paragraph describes another parameter estimation method that uses the Independent Component Analysis (ICA) technique to compute the mixing matrix. The de-mixing matrix may then be computed, by performing an inverse of the mixing matrix. ICA is a technique that finds a linear representation of non-Gaussian multivariate data such that the resulted components are statistically independent. The electric meter or the electric meter system has several unique properties, which form bases for the employment of the ICA technique in solving for the mixing matrix A:

The first basis for using ICA, also referred herein as ICA basis 1, may be as follows: Consider multiple AC cycles. For the $l^{th}$ AC cycle of a branch j, denote the time-average electric current of its first half-cycle (i.e., $\theta=0$ to $\theta=\pi$) as $\bar{i}_j(l)$. Consider $\Delta_j(l)=\bar{i}_j(l)-\bar{i}_j(l-1)$ and let $\Delta(l)$ denote the column vector of $[\Delta_1(l), \Delta_2(l), \ldots, \Delta_n(l)]^T$. In many realistic setups, the loads behind different branches change independently of each other at the time granularity of the AC cycle level (i.e., sub-second time granularity). Hence for each l and for $j_1 \neq j_2$, $\Delta_{j_1}(l)$ and $\Delta_{j_2}(l)$ are statistically independent. Further, instead of the average value for a first half cycle, the method may also consider other signals, including the instantaneous electric current value at certain radian (e.g., $\theta=\pi/2$) of each AC cycle, or the amplitude of some harmonic of the electric current signal.

This method examines the difference between neighboring AC cycles $\Delta_j(l)$, instead of the average value for the electric current of each AC cycle $\bar{i}_j(l)$ itself. This is because for $\bar{i}_j(l)$, there can often be correlation between two different branches, e.g., branches in an office tend to consume more power during working hours. The method may also be applied to consider nearby AC cycles, if continuous sampling is not available.

The method examines the difference at the AC cycle level (i.e., sub-second time granularity). Zooming into such a fine granularity sparsifies the changing events in the system, such that the correlation at larger time scale, e.g., between working hours and off hours, could be eliminated. However, zooming into a time granularity below AC cycle may also cause correlation between branches. Specifically, there may be dependency between the instantaneous electric current and the radian $\theta$, for example, the instantaneous amplitudes of electric current at $$\theta = \frac{\pi}{2} \text{ and } \frac{3\pi}{2}$$

tend to be larger than those at $\theta=0$ and $\pi$, due to the fact that the instantaneous voltage peaks at $$\theta = \frac{\pi}{2} \text{ and } \frac{3\pi}{2}$$

and returns to zero at $\theta=0$ and $\pi$.

The second basis for using ICA, also referred herein as basis 2, may be as follows: The distribution of $\Delta_j(l)$ is non-Gaussian. This tends to be true if there is relatively small number of loads behind a branch, with each having a relatively small number of major power consumption states.

With the above properties, ICA may be used to help estimate the mixing matrix A based on the information of the independence between the components of $\Delta(l)$.

Figure 16:
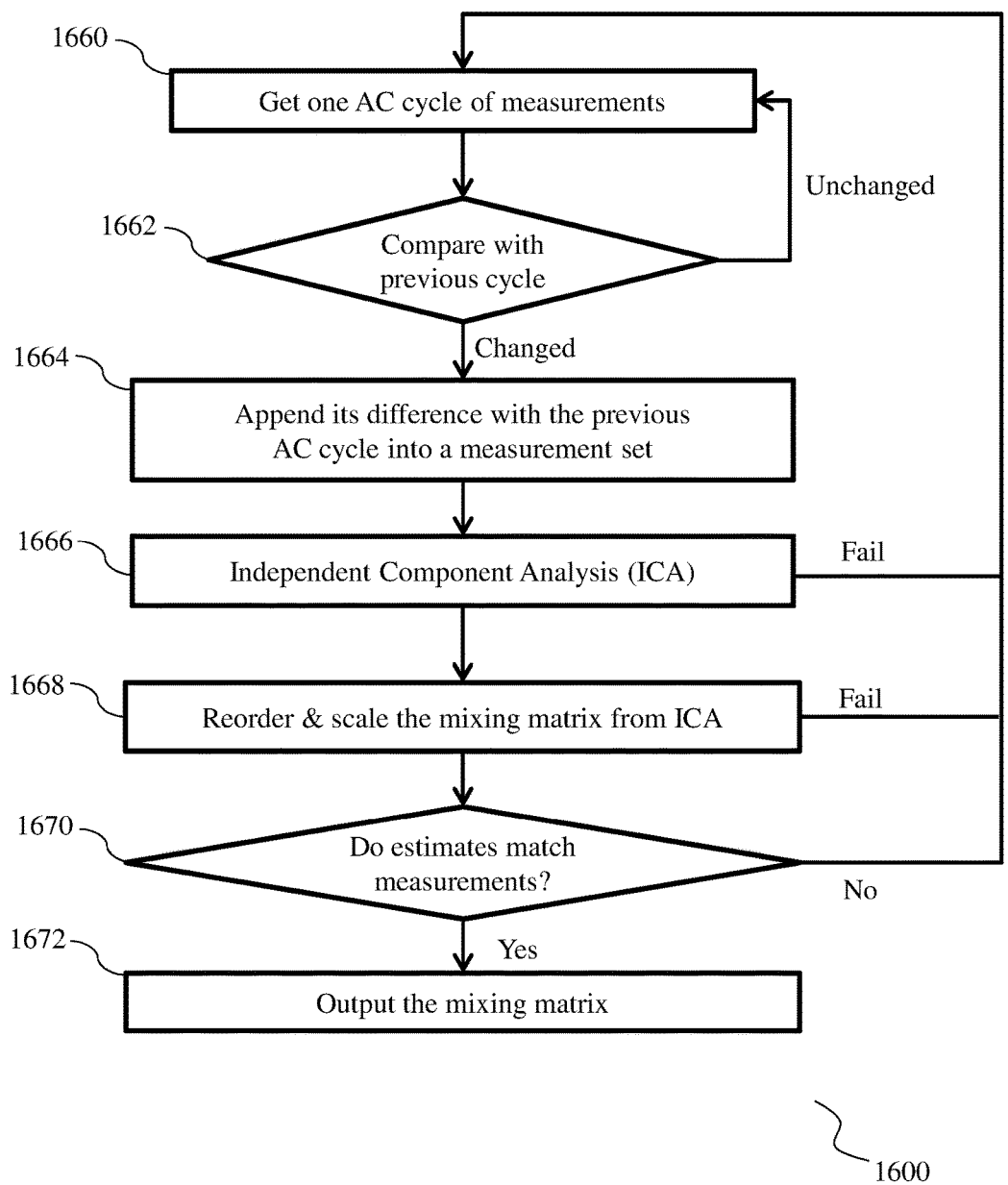
FIG. 16 shows a flow diagram showing a method of computing a mixing matrix using the Independent Component Analysis (ICA) method.

FIG. 16 shows a flow diagram 1600 showing a method of computing the mixing matrix for an electric meter, in accordance to various embodiments. The mixing matrix may be used by the electric meter to compute a de-mixing matrix for the determination of the current vector. The flow diagram 1600 shows the main steps of a proposed ICA-based method. The method repeatedly takes in new measurements from the magnetic sensors and the total electric current measurement until it can output the mixing matrix A. To simplify the following discussion without loss of generality, consider the case where m=n (i.e., the number of magnetic sensors is the same as the number of branches in the distribution board) and the $j^{th}$ magnetic sensor is the closest sensor to the circuit breaker of the $j^{th}$ branch. The method may be easily generalized to the case with m>n.

For each new AC cycle, the first step 1660 gathers the magnetic sensor measurements. The next step 1662 checks whether the measurement of the current AC cycle is different from those of its previous AC cycle.

If change is detected, the next step 1664 prepares a new vector of measurement data and appends it to a measurement set. The new vector is prepared so that it corresponds to a linear mixture of the components of $\Delta_j(l)$. Specifically, for the $l^{th}$ AC cycle of the $j^{th}$ magnetic sensor, denote the time-average measurement result of its first half-cycle (i.e., $\theta=0$ to $\theta=\pi$) as $\bar{s}_j(l)$ and denote $\Gamma_j(l)=\bar{s}_j(l)-\bar{s}_j(l-1)$. $\Gamma(l)$ denotes the column vector of $[\Gamma_1(l), \Gamma_2(l), \ldots, \Gamma_m(l)]^T$. This step computes $\Gamma(l)$ and appends $\Gamma(l)$ to a measurement data set. Since the calculations of time-average measurement and the calculation of the difference between two AC cycles are both linear operations, the linear relationship between the instantaneous magnetic sensor measurements and the instantaneous per-branch electric current values remains, i.e.:

$$\Gamma(l) = A \times \Delta(l) \quad \text{[Equation 10]}$$

This step 1664 also processes the total electric current measurement. Specifically, for the $l^{th}$ AC cycle, the time-average total electric current of its first half-cycle (i.e., for θ=0 to θ=π) may be denoted as $\bar{i}_{total}(l)$ and $\delta_{total}(l)=\bar{i}_{total}(l)-\bar{i}_{total}(l-1)$. This step computes $\delta_{total}(l)$ and appends it to the measurement set. $\delta_{total}(l)$ may be used in a latter step 1668 to scale the mixing matrix.

The next step 1666 performs Independent Component Analysis (ICA) over the available measurement set of Γ(l). The bases for conducting ICA are the assumptions that the components of Δ(l) are statistically independent and have non-Gaussian distributions. In principle, ICA finds these independent components by maximizing the statistical independence of the estimated components. In practice, there are alternative ways to define independence, for example, the minimization of mutual information, or the maximization of non-Gaussianity. There is a wide array of available ICA algorithms, for example, the FastICA algorithm. The proposed method may use existing ICA algorithms to estimate the independent components. The output of an ICA algorithm may include a candidate solution of the independent components Δ'(l) and the corresponding mixing matrix A', such that:

$$\Gamma(l)=A'\times\Delta'(l) \qquad \text{[Equation 11]}$$

Although both Δ'(l) and Δ(l) are supposed to consist of statistically independent components, Δ'(l) can may still be different from Δ(l). Hence A' may be different from A. This is due to the following two inherent ambiguities for an ICA model:

The first ICA ambiguity, also referred herein as ICA ambiguity 1, may be as follows: ICA method cannot determine the variances (or absolute scales) of the independent components.

The second ICA ambiguity, also referred herein as ICA ambiguity 2, may be as follows: ICA method cannot determine the order of the independent components.

To deal with such ambiguities, the next step 1668 reorders and scales the mixing matrix A' as output by the ICA algorithm. The ICA ambiguity 1 means that one can change each column of A' by multiplying the column with any non-zero scalar multiplier and still retain the independence of the resulted components. This ambiguity does not affect the ratios between the elements of a single column in A'. For the setup where m=n and the $j^{th}$ magnetic sensor is closest to the $j^{th}$ branch, a corresponding column in the mixing matrix will have the $j^{th}$ element being the one with the maximum absolute value out of all elements in that column. This step uses this property to reorder A', such that in the reordered matrix, the $j^{th}$ column may have its $j^{th}$ element as the one with the maximum absolute value out of all of its elements. For m>n, similar requirement on the relative absolute value of different elements in each column may be derived based on the relative position of each sensor to the different branches. If such a reordering cannot be done, the step fails and more measurement data may need to be collected.

After a successful reordering of A', each of the n columns needs to be rescaled by a multiplier scalar, so that the resulted Δ'(l) is the actual measure of the per-branch electric currents (instead of just a scaled version of the actual measures). The scaling factors may be denoted by the row factor $x=[x_1, x_1, \ldots, x_n]$. The application of Property 6, i.e., the sum of the per-branch electric currents equals to the total electric current, leads to:

$$\delta_{total}(l)=x\times\Delta'(l) \qquad \text{[Equation 12]}$$

With L AC cycles, $\delta_{total}$ may be denoted as the corresponding L-element row vector of $[\delta_{total}(1), \delta_{total}(2), \ldots \delta_{total}(L)]$, and Δ' may be denoted as the corresponding n×L matrix of $[\Delta'(1), \Delta'(2), \ldots \Delta'(L)]$. If there is a sufficiently large and diverse collection of samples of L AC cycles so that the matrix Δ' has full row rank, the step 1668 may use least-squares method to find a good candidate for the value of x. Then the final matrix A may be computed by dividing the $j^{th}$ column of A' by $x_j$ for each $j\in\{1, \ldots, m\}$. Alternatively, the scaling may also be done in a similar way as in the dominating-branch method described above. Specifically, by observing the values of Δ', if some column's corresponding branch is a dominating branch between some AC cycles, the scaling for that column may be done as in the dominating-branch-based method. After the scaling of each single column is done, the impact of its corresponding branch may be properly subtracted away, which may then result in some other remaining branches becoming dominating branches between certain AC cycles. This process may be repeated until all branches had been a dominating branch at least once.

Once a candidate mixing matrix is generated, the next step 1670 tests it against the available measurement data. The test includes the checking of Property 6, i.e., whether the sum of the estimated per-branch electric currents (as computed by [Equation 2]) equals to the measured total electric current $i_{total}$. If the mixing matrix candidate passes the test, it may be output at the final step 1672; otherwise, the method returns to the first step 1660 to continue gathering of new measurement data.

In summary, the processing circuit of an electric meter or at least one of the daughter processing circuits or mother processing circuit of an electric meter system may be configured to compute a de-mixing matrix by performing an independent component analysis computation. The processing circuit, daughter processing circuit or mother processing circuit may be configured to generate a measurement dataset and further configured to estimate the current of each branch based on the measurement dataset and maximization of a statistical independence between the current of each branch, to determine an intermediate matrix. The measurement dataset may be generated based on determining a differential magnetic field vector and appending the differential magnetic field vector to the measurement dataset. The differential magnetic field vector may be a difference between a magnetic field vector and a preceding magnetic field vector. The processing circuit, daughter processing circuit or mother processing circuit may be configured to re-order the intermediate matrix and further configured to scale the intermediate matrix based on the total current.

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced. It will be appreciated that common numerals, used in the relevant drawings, refer to components that serve a similar or the same purpose.

The invention claimed is:
1. An electric meter comprising:
   a sensor circuit configured to provide a plurality of instantaneous magnetic field measurements;
   a processing circuit configured to generate a time-series of magnetic field vectors, each magnetic field vector of the time-series of magnetic field vectors comprising the plurality of instantaneous magnetic field measurements;

a measurement device configured to provide a measurement of a total current of a plurality of branches of a power distribution network; and a total current determination circuit configured to determine the total current based on the measurement from the measurement device;

wherein the processing circuit is further configured to compute a de-mixing matrix based on the determined total current and the time-series of magnetic field vectors, and further configured to linear transform each magnetic field vector using the de-mixing matrix to determine a current of each branch of the plurality of branches, and wherein the de-mixing matrix is an inverse of a mixing matrix having full column rank, the mixing matrix defining a linear relationship between said each magnetic field vector and a corresponding current vector comprising a plurality of instantaneous currents of the plurality of branches.

2. The electric meter of claim 1, wherein each instantaneous magnetic field measurement of the plurality of instantaneous magnetic field measurements is a measurement of a sum of magnetic fields resulting from a subset of the plurality of branches.

3. The electric meter of claim 1, further comprising an attachment member configured to attach the sensor circuit above an electricity distribution board.

4. The electric meter of claim 1, wherein the sensor circuit comprises a plurality of magnetic field sensors, a quantity of the plurality of magnetic field sensors being at least equal to a quantity of the plurality of branches.

5. The electric meter of claim 4, wherein at least one magnetic field sensor of the plurality of magnetic field sensors is an anisotropic magnetoresistance sensor.

6. The electric meter of claim 4, wherein each magnetic field sensor of the plurality of magnetic field sensors is positioned in a vicinity of a respective circuit breaker of a plurality of circuit breakers of an electricity distribution board.

7. The electric meter of claim 4, wherein the sensor circuit further comprises a plurality of supporting circuits, each supporting circuit of the plurality of supporting circuits coupled to a respective magnetic field sensor of the plurality of magnetic field sensors.

8. The electric meter of claim 7, wherein each supporting circuit comprises a high pass filter.

9. The electric meter of claim 7, wherein each supporting circuit is configured to receive analog signals from the respective magnetic field sensor and further configured to at least one of amplify the analog signals or shift a direct current bias of the analog signals.

10. The electric meter of claim 1, further comprising an installer configured to turn off all branches of the plurality of branches and then sequentially turn on each branch.

11. The electric meter of claim 1, wherein the processing circuit is configured to identify a dominant branch, the dominant branch being one of an only branch of the plurality of branches having a non-zero current or an only branch of the plurality of branches having a non-zero change in current.

12. The electric meter of claim 11, wherein the processing circuit is configured to compute a de-mixing matrix based on a plurality of identified dominant branches.

13. The electric meter of claim 1, wherein the processing circuit is configured to compute a de-mixing matrix by performing an independent component analysis computation.

14. The electric meter of claim 1, wherein the processing circuit is configured to generate a measurement dataset and further configured to estimate the current of each branch of the plurality of branches based on the measurement dataset and maximisation of a statistical independence between the current of each branch of the plurality of branches, to determine an intermediate matrix.

15. The electric meter of claim 14, wherein the processing circuit is configured to re-order the intermediate matrix; and
    further configured to scale the intermediate matrix based on the total current.

16. The electric meter of claim 14, wherein the processing circuit is configured to generate the measurement dataset based on
    determining a differential magnetic field vector, wherein the differential magnetic field vector is a difference between a magnetic field vector and a preceding magnetic field vector; and
    for a plurality of time cycles, appending the differential magnetic field vector to the measurement dataset.

17. The electric meter of claim 1, wherein the processing circuit comprises a secondary supporting circuit configured to receive analog signals from the sensor circuit.

18. The electric meter of claim 17, wherein the secondary supporting circuit is further configured to at least one of remove external interferences from the analog signals, amplify the analog signals or shift a direct current bias of the analog signals.

19. The electric meter of claim 1, wherein the processing circuit comprises an analog-to-digital converter.

20. The electric meter of claim 1, wherein the processing circuit comprises a processor configured to at least one of generate the magnetic field vectors, compute the de-mixing matrix or linear transform the magnetic field vectors.

21. The electric meter of claim 1, wherein the processing circuit comprises a transceiver configured to communicate with at least one of a user interface, a measurement device or a further processing circuit.

22. The electric meter of claim 21, wherein the transceiver is configured to wirelessly communicate with the at least one of a user interface, a measurement device or a further processing circuit.

23. The electric meter of claim 1, wherein the processing circuit is further configured to determine a power consumption of each branch of the plurality of branches based on the current usage of the respective branch.

24. The electric meter of claim 1, further comprising a user interface configured to display a measurement of at least one branch of the plurality of branches.

25. An electric meter system comprising:
    a plurality of electric meters;
    a mother processing circuit;
    a measurement device configured to provide a measurement of a total current of a plurality of branches of a power distribution network; and
    a total current determination circuit configured to determine the total current based on the measurement from the measurement device;
    wherein each electric meter of the plurality of electric meters comprises
    a sensor circuit configured to provide a plurality of instantaneous magnetic field measurements; and a daughter processing circuit configured to generate a time-series of magnetic field vectors, each magnetic field vector of the time-series of magnetic field vectors comprising the plurality of instantaneous magnetic field measurements;

wherein the mother processing circuit is configured to receive partially processed data from at least one electric meter of the plurality of electric meters and further configured to provide a current reading to a user interface;

wherein at least one of the mother processing circuit or the daughter processing circuits of the plurality of electric meters is configured to compute a de-mixing matrix based on the determined total current and the time-series of magnetic field vectors, and further configured to linear transform each magnetic field vector using the de-mixing matrix to determine a current of each branch of the plurality of branches, and wherein the de-mixing matrix is an inverse of a mixing matrix having full column rank, the mixing matrix defining a linear relationship between said each magnetic field vector and a corresponding current vector comprising a plurality of instantaneous currents of the plurality of branches.

26. A method of providing branch-level readings for a power distribution network, the method comprising:

providing a plurality of instantaneous magnetic field measurements using a sensor circuit;

generating a time-series of magnetic field vectors using a processing circuit, wherein each magnetic field vector of the time-series of magnetic field vectors comprises the plurality of instantaneous magnetic field measurements;

provide a measurement of a total current of a plurality of branches of a power distribution network using a measurement device;

determining the total current based on the measurement from the measurement device using a total current determination circuit;

computing a de-mixing matrix based on the determined total current and the time-series of magnetic field vectors, using the processing circuit; and linear transforming each magnetic field vector using the de-mixing matrix to determine a current of each branch of the plurality of branches, using the processing circuit, wherein the de-mixing matrix is an inverse of a mixing matrix having full column rank, the mixing matrix defining a linear relationship between said each magnetic field vector and a corresponding current vector comprising a plurality of instantaneous currents of the plurality of branches.

* * * * *